US011812625B2

(12) United States Patent
Nozawa

(10) Patent No.: US 11,812,625 B2
(45) Date of Patent: Nov. 7, 2023

(54) PHOTOELECTRIC CONVERTER AND IMAGE SENSOR

(71) Applicant: Panasonic Intellectual Property Management Co., Ltd., Osaka (JP)

(72) Inventor: Katsuya Nozawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 601 days.

(21) Appl. No.: 17/080,938

(22) Filed: Oct. 27, 2020

(65) Prior Publication Data

US 2021/0043861 A1 Feb. 11, 2021

Related U.S. Application Data

(63) Continuation of application No. PCT/JP2019/038303, filed on Sep. 27, 2019.

(30) Foreign Application Priority Data

Oct. 17, 2018 (JP) ................................ 2018-195808

(51) Int. Cl.
*H01L 23/00* (2006.01)
*H10K 30/87* (2023.01)
(Continued)

(52) U.S. Cl.
CPC ............. *H10K 30/87* (2023.02); *H10K 30/82* (2023.02); *H10K 85/113* (2023.02); *H10K 85/215* (2023.02); *H10K 85/311* (2023.02)

(58) Field of Classification Search
CPC ............................... H10K 30/87; H10K 30/82
See application file for complete search history.

(56) References Cited

U.S. PATENT DOCUMENTS

2014/0001455 A1 1/2014 Holmes et al.
2017/0328776 A1 11/2017 Shimasaki et al.
(Continued)

FOREIGN PATENT DOCUMENTS

JP 2009-152242 7/2009
JP 2017-118284 6/2017
(Continued)

OTHER PUBLICATIONS

Extended European Search Report dated Nov. 12, 2021 for the related European Patent Application No. 19872519.4.
(Continued)

*Primary Examiner* — Anthony Ho
(74) *Attorney, Agent, or Firm* — McDermott Will & Emery LLP

(57) ABSTRACT

A photoelectric converter includes a first electrode containing a transparent conductive material, a second electrode, and a multilayer body that is positioned between the first electrode and the second electrode, and that has a photoelectric conversion function. The multilayer body includes a first layer and a second layer positioned between the first layer and the second electrode. The first layer absorbs light in a first wavelength band of 360 nm or longer and transmits light in a second wavelength band, the second wavelength band including wavelengths longer than wavelengths included in the first wavelength band. The second layer absorbs the light in the second wavelength band. The multilayer body substantially does not have sensitivity for photoelectric conversion in the first wavelength band and has sensitivity for photoelectric conversion in the second wavelength band.

9 Claims, 17 Drawing Sheets

(51) Int. Cl.

| | |
|---|---|
| ***H10K 30/82*** | (2023.01) |
| ***H10K 85/10*** | (2023.01) |
| ***H10K 85/20*** | (2023.01) |
| ***H10K 85/30*** | (2023.01) |

(56) References Cited

U.S. PATENT DOCUMENTS

| | | | |
|---|---|---|---|
| 2018/0198005 | A1 | 7/2018 | Siegmund et al. |
| 2019/0081107 | A1 | 3/2019 | Nakata et al. |

FOREIGN PATENT DOCUMENTS

| | | |
|---|---|---|
| JP | 2017-220577 | 12/2017 |
| JP | 2018-125495 | 8/2018 |
| JP | 2018-525831 | 9/2018 |
| WO | 2017/081847 | 5/2017 |
| WO | 2017/169719 | 10/2017 |
| WO | 2018/025545 | 2/2018 |

OTHER PUBLICATIONS

International Search Report of PCT application No. PCT/JP2019/038303 dated Dec. 17, 2019.

PHOTOELECTRIC CONVERTER AND IMAGE SENSOR

BACKGROUND

1. Technical Field

The present disclosure relates to a photoelectric converter and an image sensor.

2. Description of the Related Art

An image pickup device with a high-performance image sensor is demanded in self-driving techniques for automobiles, outdoor monitoring techniques, and so on. The image pickup device used in automobiles, for example, is required to pick up images with both visible light and infrared light in some cases. Japanese Unexamined Patent Application Publication No. 2017-118284 discloses an image pickup device with a double-band pass filter including optical filters that selectively transmit lights in a visible light band and an infrared light band therethrough.

SUMMARY

In one general aspect, the techniques disclosed here feature a photoelectric converter including a first electrode containing a transparent conductive material, a second electrode, and a multilayer body that is positioned between the first electrode and the second electrode, and that has a photoelectric conversion function. The multilayer body includes a first layer and a second layer positioned between the first layer and the second electrode. The first layer absorbs light in a first wavelength band of 360 nm or longer and transmits light in a second wavelength band, the second wavelength band including wavelengths longer than wavelengths included in the first wavelength band. The second layer absorbs the light in the second wavelength band. The multilayer body substantially does not have sensitivity for photoelectric conversion in the first wavelength band and has sensitivity for photoelectric conversion in the second wavelength band.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
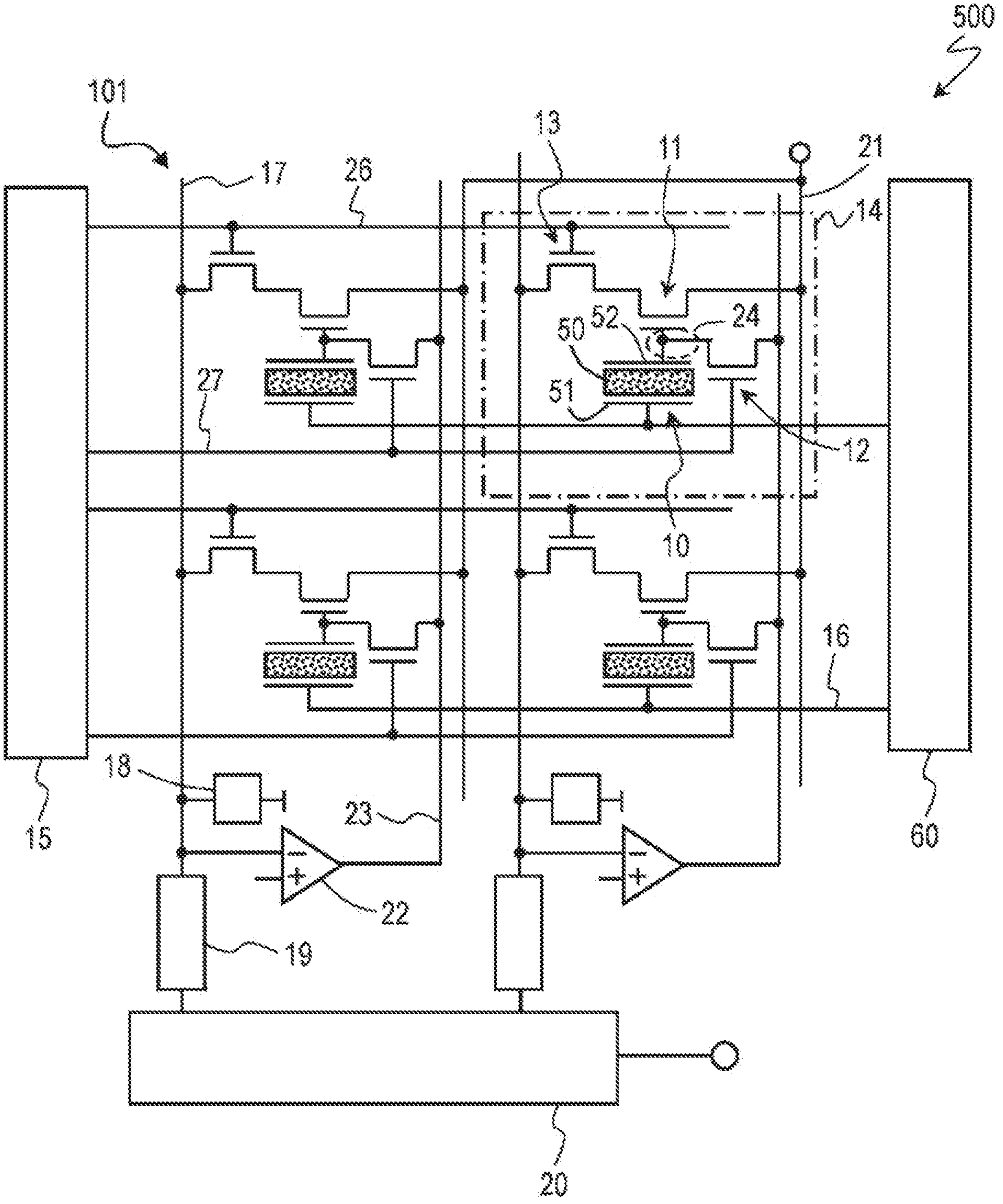
FIG. 1 is a schematic view illustrating a circuit configuration of an image pickup device according to one aspect of the present disclosure.

In general, a double-band pass filter transmitting lights in different wavelength range bands therethrough is difficult to realize only with optical filters. The reason is that, even when two band pass filters having different transmission wavelength bands are laminated, the transmission wavelength band of one of the two band pass filters is positioned in a stop band of the other band pass filter.

The double-band pass filter is realized by, for example, combining a band pass filter that has a wide wavelength transmission band of which lower end and upper end are given by a lower end of one of two transmission wavelength bands, the one band being positioned in a shorter wavelength range, and by a higher end of the other transmission wavelength band that is positioned in a longer wavelength range, respectively, with a band stop filter (notch filter) that has a low transmittance between an upper end of the transmission wavelength range band on a shorter wavelength side and a lower end of the transmission wavelength band on a longer wavelength side. Because it is difficult to realize the above-mentioned type of band pass filter with an absorption filter, an interference filter constituted by a dielectric multilayer film is generally used as the band stop filter. However, the interference filter exhibits a spectrum transmission characteristic depending on an incident angle. Accordingly, a satisfactory image is difficult to obtain, for example, when the image pickup device is used to pick up an image in a wide angle mode.

The inventor of the present disclosure has succeeded in obtaining a photoelectric converter and an image sensor each of which has sensitivity selectively in a particular wavelength band without using the absorption filter, the interference filter, and so on. The photoelectric converter and the image according to the present disclosure are summarized as follows.

Item 1

A photoelectric converter according to Item 1 of the present disclosure includes a first electrode containing a transparent conductive material, a second electrode, and a multilayer body that is positioned between the first electrode and the second electrode, and that has a photoelectric conversion function. The multilayer body includes a first layer and a second layer positioned between the first layer and the second electrode. The first layer absorbs light in a first wavelength band of 360 nm or longer and transmits light in a second wavelength band, the second wavelength band including wavelengths longer than wavelengths included in the first wavelength band. The second layer absorbs the light in the second wavelength band. The multilayer body substantially does not have sensitivity for photoelectric conversion in the first wavelength band and has sensitivity for photoelectric conversion in the second wavelength band.

Item 2

In the photoelectric converter according to Item 1, the multilayer body may further include a third layer positioned between the first electrode and the first layer, the third layer may absorb light in a third wavelength band including wavelengths shorter than the wavelengths included in the first wavelength band, and may transmit the light in the first wavelength band and the light in the second wavelength band, and the multilayer body may have sensitivity for photoelectric conversion in the third wavelength band.

Item 3

In the photoelectric converter according to Item 1 or 2, the first layer may have charge transport ability.

Item 4

In the photoelectric converter according to Item 2, the third layer may have charge transport ability.

Item 5

In the photoelectric converter according to Item 1, a total of external quantum efficiencies of all layers included in the multilayer body in the first wavelength band, the layers including the first layer and the second layer, may be smaller than a total of external quantum efficiencies of all the layers in the second wavelength band.

Item 6

In the photoelectric converter according to Item 2, a total of external quantum efficiencies of all layers included in the multilayer body in the first wavelength band, the layers including the first layer, the second layer, and the third layer, may be smaller than a total of external quantum efficiencies of all the layers in the second wavelength band, and may be smaller than a total of external quantum efficiencies of all the layers in the third wavelength band.

Item 7

In the photoelectric converter according to Item 1, the first layer may contain tin phthalocyanine and $C_{60}$, and the second layer may contain lead phthalocyanine and $C_{60}$.

Item 8

In the photoelectric converter according to Item 2, the first layer may contain tin phthalocyanine and $C_{60}$, the second layer may contain lead phthalocyanine and $C_{60}$, and the third layer may contain poly(3-hexylthiophene) and phenyl-$C_{61}$ butyric acid methyl ester.

Item 9

An image sensor according to Item 9 of the present disclosure includes photoelectric converters including first electrodes, multilayer bodies and second electrodes. Each of the photoelectric converters is the photoelectric converter according to any one of Items 1 to 8. Each of the first electrodes is the first electrode of the photoelectric converter according to any one of Items 1 to 8. Each of the multilayer bodies is the multilayer body of the photoelectric converter according to any one of Items 1 to 8. Each of the second electrodes is the second electrode of the photoelectric converter according to any one of Items 1 to 8. The first electrodes of the photoelectric converters are connected to one another. The multilayer bodies of the photoelectric converters are connected to one another. The second electrodes of the photoelectric converters are separated from one another. The photoelectric converters are arranged one-dimensionally or two-dimensionally.

The photoelectric converter and the image sensor according to the present disclosure will be described below with reference to the drawings.

1. Outline of Image Pickup Device Including Image Sensor

First, an image pickup device to which an image sensor according to the present disclosure is applied will be overviewed. FIG. 1 schematically illustrates a circuit configuration of an image pickup device 500. The image pickup device 500 includes an image sensor 101 including multiple pixels 14, and peripheral circuits.

The multiple pixels 14 are arrayed two-dimensionally, namely in a row direction and a column direction, on a semiconductor substrate and form a pixel region. The image sensor 101 may be a line sensor. In such a case, the multiple pixels 14 may be arrayed one-dimensionally. In the specification of the present disclosure, the row direction and the column direction indicate directions in which a row and a column extend, respectively. In other words, a vertical direction is the column direction, and a horizontal direction is the row direction.

Each of the pixels 14 includes a photoelectric converter 10, an amplifier transistor 11, a reset transistor 12, and an address transistor 13 serving as a row select transistor. The photoelectric converter 10 includes a first electrode 51 that is a transparent electrode, a second electrode 52 that is a pixel electrode, and a multilayer body 50 sandwiched between the first electrode 51 and the second electrode 52, the multilayer body 50 having a photoelectric conversion function. The image sensor 101 may include a voltage control element for applying a predetermined voltage to the first electrode 51. The voltage control element is, for example, a voltage control circuit, a voltage generation circuit such as a constant voltage source, or a voltage reference line such as a ground line. The voltage applied by the voltage control element is called a control voltage. The image sensor 101 may include, for example, a voltage control circuit 60 as the voltage control element. The voltage control circuit 60 may generate a constant control voltage or multiple control voltages of different values. The voltage control circuit 60 may generate, for example, control voltages of two or more different values or a control voltage continuously varying over a predetermined range. The voltage control circuit 60 determines a value of the generated control voltage in accordance with a command from an operator who operates the image pickup device 500, or with a command from, for example, another control unit included in the image pickup device 500, and generates the control voltage of the determined value. The voltage control circuit 60 is disposed as part of the peripheral circuits outside a photosensitive region. In other words, the voltage control circuit 60 may be disposed in the image sensor 101.

For example, the voltage control circuit 60 may generate two or more different control voltages and may apply the control voltages to the first electrode 51 to change a spectral sensitivity characteristic of the multilayer body 50. The spectral sensitivity characteristic changing as mentioned above includes a spectral sensitivity characteristic with which sensitivity of the multilayer body 50 becomes zero for the light to be detected. With this feature, in the image pickup device 500, the influence of incident light during read of a detection signal can be made substantially zero by applying, for example, the control voltage at which the sensitivity of the multilayer body 50 becomes zero to the first electrode 51 from the voltage control circuit 60 during a period in which the pixel 14 performs the read of the detection signal per row. Hence a global shutter operation can be realized even when the detection signal is read substantially per row.

In this embodiment, as illustrated in FIG. 1, the spectral sensitivity characteristic of the photoelectric converter 10 is changed by applying, through a counter electrode signal line 16, the control voltage to the first electrode 51 in each of the pixels 14 that are arrayed in the row direction, thereby changing a voltage between the second electrode 52 and the first electrode 51. As an alternative, an electronic shutter operation may be realized by applying the control voltage such that the spectral sensitivity characteristic with which the sensitivity to light becomes zero is obtained at a predetermined timing during the image pickup. The control voltage may be applied to the second electrode 52 instead. In order to accumulate electrons, as signal charges, at the second electrode 52 by irradiating the photoelectric converter 10 with light, the second electrode 52 is set to a higher potential than the first electrode 51. At that time, a current flows from the second electrode 52 to the first electrode 51. In order to accumulate holes, as signal charges, at the second electrode 52 by irradiating the photoelectric converter 10 with light, the second electrode 52 is set to a lower potential than the first electrode 51. At that time, a current flows from the first electrode 51 to the second electrode 52.

The second electrode 52 is connected to a gate electrode of the amplifier transistor 11, and the signal charges collected by the second electrode 52 are accumulated at a charge accumulation node 24 that is positioned between the second electrode 52 and the gate electrode of the amplifier transistor 11. The signal charges are holes in this embodiment, but the signal charges may be electrons.

The signal charges accumulated at the charge accumulation node 24 are applied, as a voltage corresponding to an amount of the signal charges, to the gate electrode of the amplifier transistor 11. The amplifier transistor 11 forms a signal detection circuit and amplifies the voltage applied to the gate electrode. The address transistor 13 selectively reads, as a signal voltage, the amplified voltage. The reset transistor 12 is connected at its source/drain electrode to the second electrode 52 and resets the signal charges accumulated at the charge accumulation node 24. In other words, the reset transistor 12 resets the potential at the gate electrode of the amplifier transistor 11 and at the second electrode 52.

To selectively perform the above-described operation in the multiple pixels 14, the image pickup device 500 includes a power supply wiring 21, a vertical signal line 17, an address signal line 26, and a reset signal line 27, and those lines are connected to each of the pixels 14. More specifically, the power supply wiring 21 is connected to the source/drain electrode of the amplifier transistor 11, and the vertical signal line 17 is connected to a source/drain electrode of the address transistor 13. The address signal line 26 is connected to a gate electrode of the address transistor 13. The reset signal line 27 is connected to the gate electrode of the reset transistor 12.

The peripheral circuits include a vertical scanning circuit 15, a horizontal signal read circuit 20, multiple column signal processing circuits 19, multiple load circuits 18, and multiple differential amplifiers 22. The vertical scanning circuit 15 is also called a row scanning circuit. The horizontal signal read circuit 20 is also called a column scanning circuit. The column signal processing circuit 19 is also called a row signal accumulation circuit. The differential amplifier 22 is also called a feedback amplifier.

The vertical scanning circuit 15 is connected to both the address signal line 26 and the reset signal line 27 and selects the multiple pixels 14, arrayed for each row, on a row by row basis, thereby performing the read of the signal voltage and the reset of the potential at the second electrode 52. The power supply wiring 21 representing a source follower power supply supplies a predetermined power supply voltage to each pixel 14. The horizontal signal read circuit 20 is electrically connected to the multiple column signal processing circuits 19. Each of the column signal processing circuits 19 is electrically connected to the pixels 14, arrayed for each row, through the vertical signal line 17 corresponding to each column. The load circuits 18 are electrically connected to the vertical signal lines 17 in a one-to-one relation. The load circuit 18 and the amplifier transistor 11 form a source follower circuit.

The multiple differential amplifiers 22 are disposed in a one-to-one relation to the columns. A negative-side input terminal of the differential amplifier 22 is connected to the corresponding vertical signal line 17. An output terminal of the differential amplifier 22 is connected to the pixel 14 through a feedback line 23 corresponding to each column.

The vertical scanning circuit 15 applies a row select signal for on/off control of the address transistor 13 to the gate electrode of the address transistor 13 via the address signal line 26. Thus a read target row is scanned and selected. The signal voltages are read from the pixels 14 in the selected row to the vertical signal line 17. Furthermore, the vertical scanning circuit 15 applies a reset signal for on/off control of the reset transistor 12 to a gate electrode of the reset transistor 12 via the reset signal line 27. Thus a row of the pixels 14 that are targets of a reset operation is selected. The vertical signal line 17 transfers the signal voltages read from the pixels 14, which have been selected by the vertical scanning circuit 15, to the column signal processing circuit 19.

The column signal processing circuit 19 performs noise suppression signal processing represented by correlated double sampling, analog-digital conversion (AD conversion), and so on.

The horizontal signal read circuit 20 sequentially reads out signals from the multiple column signal processing circuits 19 to a horizontal common signal line (not illustrated).

The differential amplifier 22 is connected to the drain electrode of the reset transistor 12 via the feedback line 23. Accordingly, when the address transistor 13 and the reset transistor 12 are in a conduction state, the differential amplifier 22 receives at its negative terminal an output value of the address transistor 13. The differential amplifier 22 performs a feedback operation such that the gate potential of the amplifier transistor 11 is held at a predetermined feedback voltage. On that occasion, an output voltage value of the differential amplifier 22 is 0 V or a positive voltage near 0 V. The feedback voltage represents an output voltage of the differential amplifier 22.

Figure 2:
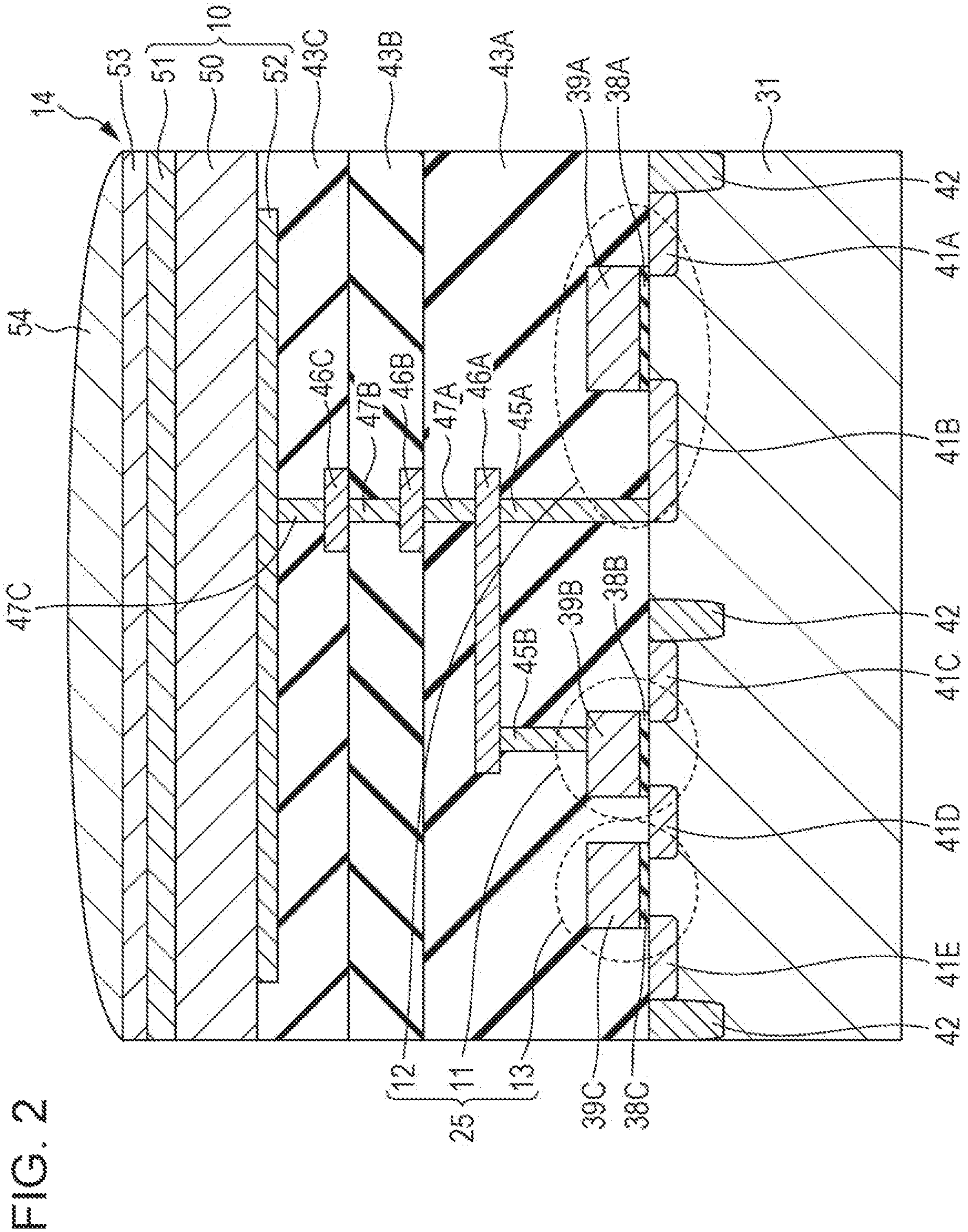
FIG. 2 is a schematic sectional view illustrating a structure of a pixel in the image pickup device according to the one aspect of the present disclosure.

FIG. 2 schematically illustrates a section of a device structure of the pixel 14 in the image pickup device 500. The pixel 14 includes a semiconductor substrate 31, a charge detection circuit 25, and the photoelectric converter 10. The semiconductor substrate 31 is, for example, a p-type silicon substrate. The charge detection circuit 25 detects the signal charges collected by the second electrode 52 and outputs the signal voltage. The charge detection circuit 25 includes the amplifier transistor 11, the reset transistor 12, and the address transistor 13, and it is formed on and in the semiconductor substrate 31.

The amplifier transistor 11 includes n-type impurity regions 41C and 41D that are formed in the semiconductor substrate 31 and that function as a drain electrode and a source electrode, respectively, a gate insulating layer 38B that is positioned on the semiconductor substrate 31, and a gate electrode 39B that is positioned on the gate insulating layer 38B.

The reset transistor 12 includes n-type impurity regions 41B and 41A that are formed in the semiconductor substrate 31 and that function as a drain electrode and a source electrode, respectively, a gate insulating layer 38A that is positioned on the semiconductor substrate 31, and a gate electrode 39A that is positioned on the gate insulating layer 38A.

The address transistor 13 includes n-type impurity regions 41D and 41E that are formed in the semiconductor substrate 31 and that function as a drain electrode and a source electrode, respectively, a gate insulating layer 38C that is positioned on the semiconductor substrate 31, and a gate electrode 39C that is positioned on the gate insulating layer 38C. The n-type impurity region 41D is shared by the amplifier transistor 11 and the address transistor 13. Hence the amplifier transistor 11 and the address transistor 13 are connected in series.

In the semiconductor substrate 31, element isolation regions 42 are each disposed between the adjacent pixels 14 and between the amplifier transistor 11 and the reset transistor 12. Electrical isolation between the adjacent pixels 14 is established by the element isolation region 42. Furthermore, leakage of the signal charges accumulated in the charge accumulation node is suppressed by the element isolation region 42.

Interlayer insulating layers 43A, 43B and 43C are laminated on the surface of the semiconductor substrate 31. A contact plug 45A connected to the n-type impurity region 41B of the reset transistor 12, a contact plug 45B connected to the gate electrode 39B of the amplifier transistor 11, and a wiring 46A connecting the contact plug 45A and the contact plug 45B are embedded in the interlayer insulating layer 43A. Thus, the n-type impurity region 41B serving as the drain electrode of the reset transistor 12 is electrically connected to the gate electrode 39B of the amplifier transistor 11. The wiring 46A is connected to the second electrode 52 through a contact plug 47A disposed in the interlayer insulating layer 43A, through a wiring 46B and a contact plug 47B both disposed in the interlayer insulating layer 43B, and through a wiring 46C and a contact plug 47C both disposed in the interlayer insulating layer 43C.

The photoelectric converter 10 is disposed on the interlayer insulating layer 43C. The photoelectric converter 10 includes the first electrode 51, the multilayer body 50, and the second electrode 52 that is positioned on a side closer to the semiconductor substrate 31 than the first electrode 51. The multilayer body 50 is sandwiched between the first electrode 51 and the second electrode 52. A structure of the multilayer body 50 will be described in detail later. The second electrode 52 is disposed on the interlayer insulating layer 43C. The first electrode 51 is formed of a semiconductor that is transparent to the light to be detected and that has electrical conductivity. For example, the first electrode 51 is made of a transparent and conductive material. More specifically, the first electrode 51 is made of, for example, indium tin oxide (ITO), aluminum-doped zinc oxide (AZO), gallium-doped zinc oxide (GZO), or few-layer-graphene (FLG). Another type of transparent and conductive semiconductor may also be used. The second electrode 52 is formed using, for example, a metal such as aluminum or copper, titanium nitride, or polysilicon doped with impurities to have electrical conductivity.

As illustrated in FIG. 2, the pixel 14 may include a color filter 53 on the first electrode 51 of the photoelectric converter 10. The pixel 14 may further include a microlens 54 on the color filter 53. The color filter 53 is, for example, a filter of red (R), blue (B), or green (G) and has a transmission wavelength band different for each pixel 14. The color filter 53 does not need to be disposed for the pixel 14 that detects light in an infrared region. As described later, the function of the color filter 53 is different from that of a wavelength filter incorporated in the multilayer body 50.

In this embodiment, the multilayer body 50 and the first electrode 51 of each pixel 14 are connected to the multilayer body 50 and the first electrode 51 of the adjacent pixel 14, respectively, thereby forming the integral multilayer body 50 and the integral first electrode 51. However, the multilayer body 50 may be separated for each pixel 14. The first electrode 51 may be connected integrally for each row or column of the pixels 14 that are arrayed in a two-dimensional pattern. On the other hand, the second electrode 52 of each pixel 14 is not connected to and is separated from the second electrode 52 of the adjacent pixel 14.

The image sensor 101 may detect a capacity change of a functional film for optical detection instead of detecting charges generated due to the photoelectric conversion. Those types of image sensor and imaging device are disclosed in, for example, International Publication No. WO2017/081847. In other words, the multilayer body 50 may generate hole-electron pairs depending on the intensity of the incident light or a capacity change depending on the intensity of the incident light. The light incident on the multilayer body 50 can be detected by detecting the generated charges or the capacity change.

2. Structure of Photoelectric Converter 10

The structure of the photoelectric converter 10 will be described in detail below. The multilayer body 50 of the photoelectric converter 10 includes multiple layers. In the specification of the present disclosure, terms relating to the photoelectric conversion function of each layer are defined as follows.

Light absorbance: A rate of the number of photons absorbed by some layer to the number of photons incident on the layer. An estimated value of the light absorbance can be determined with a simulation based on the optical constants of a material of the layer.

Rate of light absorption: A rate of photons absorbed by each layer to photons applied to the photoelectric converter 10. An estimated value of the rate of light absorption can be determined with a simulation based on the optical constants of a material of each layer.

Internal quantum efficiency: A rate of the number of electrons or holes generated in some layer and collected by the second electrode to the number of photons absorbed by the layer.

External quantum efficiency: A rate of the number of electrons or holes, which are generated with absorption of part of photons by some layer and collected by the second electrode, to the number of photons applied to the image sensor.

Figure 3:
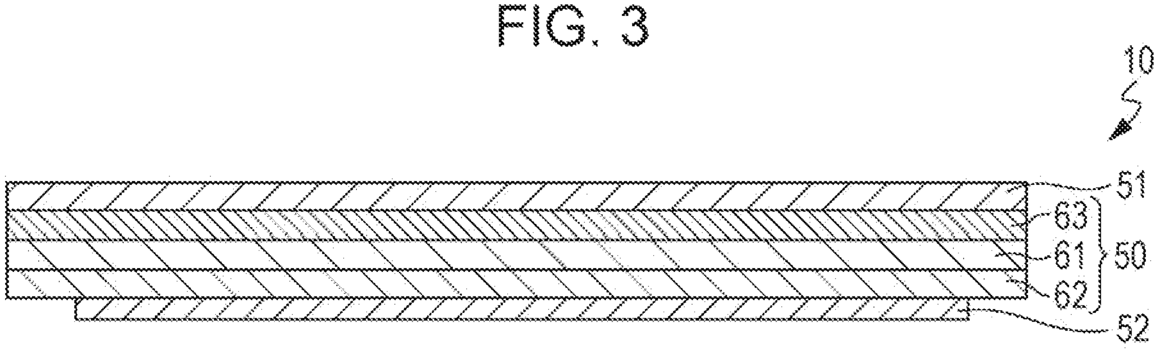
FIG. 3 is a schematic view illustrating a section of a photoelectric converter according to another aspect of the present disclosure.

FIG. 3 schematically illustrates a section of the photoelectric converter 10. As described above, the photoelectric converter 10 includes the first electrode 51, the second electrode 52, and the multilayer body 50. The multilayer body 50 has the photoelectric conversion function and is positioned between the first electrode 51 and the second electrode 52.

In this embodiment, the multilayer body 50 includes a first layer 61, a second layer 62, and a third layer 63. The first layer 61 is positioned between the first electrode 51 and the second electrode 52. The second layer 62 is positioned between the first layer 61 and the second electrode 52. The third layer 63 is positioned between the first electrode 51 and the first layer 61. In other words, the third layer 63, the first layer 61, and the second layer 62 are successively arranged from a side closer to the first electrode 51.

The first electrode 51 and the second electrode 52 sandwich the multilayer body 50 and, as described in detail later, those electrodes are electrically connected to the multilayer body 50 such that either electrons or holes generated due to the photoelectric conversion can be moved. In addition to the above-described layers, the multilayer body 50 may further include one or more layers and structures for improving characteristics of the photoelectric converter 10, such as an electron blocking layer, a hole blocking layer, and a protective layer.

The image sensor 101 includes the multiple photoelectric converters 10. The first electrodes 51 of the multiple photoelectric converters 10 are connected to one another, and the multilayer bodies 50 of the multiple photoelectric converters 10 are connected to one another. On the other hand, the second electrodes 52 are individually independent without being connected to one another, and are arranged one-dimensionally or two-dimensionally.

The first layer 61, the second layer 62, and the third layer 63 are made of materials different from one another, or those layers have nano-structures different from one another. Alternatively, the first layer 61, the second layer 62, and the third layer 63 contain the same material or nano-structure at proportions different from one another. As a result, the first layer 61, the second layer 62, and the third layer 63 have photoelectric conversion characteristics different from one another.

Figure 4:
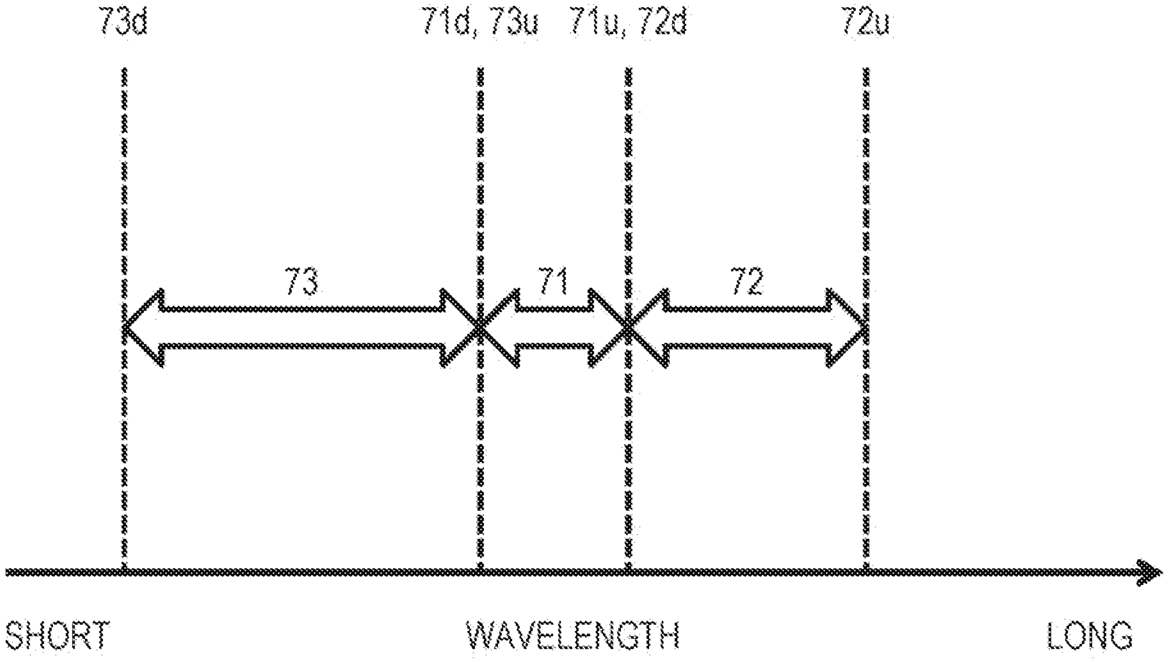
FIG. 4 is an explanatory schematic view illustrating first to third wavelength bands.

In more detail, as illustrated in FIG. 4, the first layer 61, the second layer 62, and the third layer 63 of the multilayer body 50 are constituted to mainly absorb lights in a first wavelength band 71, a second wavelength band 72, and a third wavelength band 73, respectively. The first wavelength band 71, the second wavelength band 72, and the third wavelength band 73 do not represent absorption characteristics of the first layer 61, the second layer 62, and the third layer 63, but they represent wavelength bands of lights mainly absorbed by the individual layers in the multilayer body 50. More specifically, the light in the first wavelength band 71 is most absorbed in the first layer 61 as compared with the second layer 62 and the third layer 63. Similarly, the light in the second wavelength band 72 is most absorbed in the second layer 62 as compared with the first layer 61 and the third layer 63. The light in the third wavelength band 73 is most absorbed in the third layer 63 as compared with the first layer 61 and the second layer 62.

Furthermore, the first layer 61 transmits the light in the second wavelength band therethrough, and the third layer 63 transmits the lights in the first wavelength band 71 and the second wavelength band 72 therethrough. The first layer 61 may transmit the light in the third wavelength band 73 therethrough or absorb it. The second layer 62 may transmit the light in the first wavelength band 71 and the light in the third wavelength band 73 therethrough or absorb them.

The second wavelength band 72 is a band of wavelengths equal to or longer than the wavelength at an upper end 71*u* of the first wavelength band 71, and the third wavelength band 73 is a band of wavelengths equal to or shorter than the wavelength at a lower end 71*d* of the first wavelength band 71. The first wavelength band 71 is a band of wavelengths equal to or longer than 360 nm that is the wavelength at a lower end of a visible light wavelength band. The first wavelength band 71 is included in the visible light wavelength band or an infrared light wavelength band. The third wavelength band 73 may be the visible light wavelength band or an ultraviolet light wavelength band shorter than the visible light wavelength band. In this embodiment, the third wavelength band 73 is also the visible light wavelength band. The second wavelength band 72 is the visible light wavelength band or the infrared light wavelength band.

The upper end 71*u* of the first wavelength band 71 coincides with the lower end 72*d* of the second wavelength band 72, and the lower end 71*d* of the first wavelength band 71 coincides with the upper end 73*u* of the third wavelength band 73. Accordingly, the following relations hold.

(arbitrary wavelength in the third wavelength band 73)≤(lower end 71*d* of the first wavelength band 71) (1)

(lower end 71*d* of the first wavelength band 71)≤(arbitrary wavelength in the first wavelength band 71)≤(upper end 71*u* of the first wavelength band 71) (2)

(upper end 71*u* of the first wavelength band 71)≤(arbitrary wavelength in the second wavelength band 72) (3)

The lower end 73*d* of the third wavelength band 73 and the upper end 72*u* of the second wavelength band 72 represent, respectively, the shortest wavelength and the longest wavelength at which the photoelectric converter 10 has the desired sensitivity. The desired sensitivity may change depending on the purpose of image pickup or measurement, the performance of an optical system and so on used in a combined manner, an object for which the image pickup or the measurement is to be performed, and the situations of illumination and so on.

Because the first layer 61, the second layer 62, and the third layer 63 have the above-described photoelectric conversion characteristics and are arranged in the multilayer body 50 in the above-mentioned order, the multilayer body

50 exhibits, as described in detail below, a photoelectric conversion characteristic with substantially no sensitivity in the first wavelength band 71 and with sensitivity in the second wavelength band 72 and the third wavelength band 73 for the light incident from a side including the first electrode 51. In other words, in the multilayer body 50, a total of the external quantum efficiencies of all the layers of the multilayer body 50, including the first layer 61, the second layer 62, and the third layer 63, in the first wavelength band 71 is smaller than a total of the external quantum efficiencies of all the layers of the multilayer body 50 in the second wavelength band 72 and a total of the external quantum efficiencies of all the layers of the multilayer body 50 in the third wavelength band 73.

More specifically, in the photoelectric converter 10, the second layer 62 has significantly high external quantum efficiency in the second wavelength band 72. Likewise, the third layer 63 has significantly high external quantum efficiency in the third wavelength band 73. Here, the wording "significantly high external quantum efficiency" implies that the external quantum efficiency of the photoelectric converter 10 in the relevant wavelength band is as high as enough to achieve the desired sensitivity of optical detection. The desired sensitivity may change depending on the performance demanded for the photoelectric converter 10, the performance of the optical system and so on used in a combined manner, the object for which the image pickup or the measurement is to be performed, and the situations of illumination and so on. An example of the significantly high external quantum efficiency is 10% or more.

Furthermore, in the first wavelength band 71, an average value of the external quantum efficiency of the first layer 61 is lower than an average value of the external quantum efficiency of the second layer 62 and an average value of the external quantum efficiency of the third layer 63. In the first wavelength band 71, the external quantum efficiencies of the first layer 61, the second layer 62, and the third layer 63 may be each significantly low. Here, the wording "significantly low external quantum efficiency" implies that the external quantum efficiency of the photoelectric converter 10 in the relevant wavelength band is so low and the sensitivity of optical detection is not higher than a desired level. The desired sensitivity may change depending on the performance demanded for the photoelectric converter 10, the performance of the optical system and so on used in a combined manner, the object for which the image pickup or the measurement is to be performed, and the situations of illumination and so on. An example of the significantly low external quantum efficiency is 1% or less. Stated in another way, the significantly low external quantum efficiency is, for example, ½ or less of the significantly high external quantum efficiency.

As described below, the external quantum efficiency of an n-th (n=1, 2, 3) layer is expressed by the product of a rate at which the n-th layer absorbs photons and the internal quantum efficiency of the n-th layer. The external quantum efficiency of the photoelectric converter 10 is given by the sum of the external quantum efficiencies of the three layers.

$$(\text{external quantum efficiency of the } n\text{-}th \text{ layer})=(\text{rate at which the } n\text{-}th \text{ layer absorbs photons})\times(\text{internal quantum efficiency of the } n\text{-}th \text{ layer}) \quad (4)$$

As seen from the equation (4), in order to reduce the external quantum efficiency of the n-th layer, the rate at which the n-th layer absorbs photons may be reduced, or the internal quantum efficiency of the n-th layer may be reduced. In the photoelectric converter 10 according to the present disclosure, the above-mentioned external quantum efficiencies are realized based on the equation (4) by laminating three layers made of three materials in an appropriate order.

More specifically, in the photoelectric converter 10, the third layer 63, the first layer 61, and the second layer 62 are arranged in the mentioned order from a light incident side, namely from the side closer to the first electrode 51. In the third layer 63, the rate at which the third layer absorbs photons in the third wavelength band is increased and the internal quantum efficiency is increased. Accordingly, a component of the incident light falling in the third wavelength band is absorbed by the third layer 63 such that the light of the component falling in the third wavelength band does not reach the first layer 61 and the second layer 62 both positioned on a rear side of the third layer 63. In addition, the light of the component falling in the third wavelength band is detected with the third layer 63.

In the first layer 61, the rate at which the first layer absorbs photons in the first wavelength band is increased and the internal quantum efficiency is decreased. Accordingly, a component of the incident light falling in the first wavelength band is absorbed by the first layer 61 such that the light of the component falling in the first wavelength band does not reach the second layer 62 positioned on a rear side of the first layer 61. The light in the first wavelength band is a wavelength component not to be detected, and the external quantum efficiency in the first wavelength band 71 can be reduced by decreasing the internal quantum efficiency. As a result, the light remaining after removing the components falling in the third wavelength band 73 and the first wavelength band 71 from the incident light reaches the second layer 62.

Thus, in this embodiment, the above-described photoelectric conversion characteristic is realized by not only laminating the layers made of different materials with different photoelectric conversion characteristics and using, as a filter, the layer positioned on the incident side, but also controlling the internal quantum efficiencies and adjusting the detection sensitivity.

In order to realize the above-described photoelectric conversion characteristic, the first electrode 51 has a significant transmittance at least in the second wavelength band 72 and the third wavelength band 73. In wavelength bands other than the second and third wavelength bands, the transmittance of the first electrode 51 is low and may be substantially 0. The wording "has a significant transmittance in the second wavelength band 72 and the third wavelength band 73" implies that, in the second wavelength band 72 and the third wavelength band 73, the first electrode 51 has a transmittance allowing the light to transmit therethrough to such an extent that the photoelectric converter 10 can realize the external quantum efficiency required for detection of the light. The first electrode 51 collects one of holes and electrons generated due to the photoelectric conversion in the second wavelength band 72 and the third wavelength band 73.

The second electrode 52 collects the other of the holes and the electrons.

3. Design of Multilayer Body 50

A design method for the multilayer body 50 with the above-described photoelectric conversion characteristic will be described in detail below.

(1) Absorbance

A proportion of light reaching the third layer 63 with respect to the incident light on the photoelectric converter 10 in some wavelength band is denoted by T. In this connection, Table 1 lists the absorbance and the rate of light absorption, which are defined as per described above, for each of the layers in the relevant wavelength band.

TABLE 1

| | Absorbance | Rate of Light Absorption |
|---|---|---|
| Third Layer 63 | A3 | B3 |
| First Layer 61 | A1 | B1 |
| Second Layer 62 | A2 | B2 |

Ignoring reflection at each layer, the rates of light absorption are given as follows.

$$B3=T\times A3 \quad (5)$$

$$B1=T\times(1-A3)\times A1 \quad (6)$$

$$B2=T\times(1-A3)\times(1-A1)\times A2 \quad (7)$$

The requirements for the third layer 63 to mainly absorb the light in the third wavelength band 73 are B3>B1 and B3>B2.

Here, as seen from the equations (6) and (7), the term (1−A3) is included in each of B1 and B2. This implies that the first layer 61 and the second layer 62 are positioned on the rear side of the third layer 63 with respect to the incident direction of light on the photoelectric converter 10, and that only light having not been absorbed by the third layer 63 reaches the first layer 61 and the second layer 62.

Figure 5:
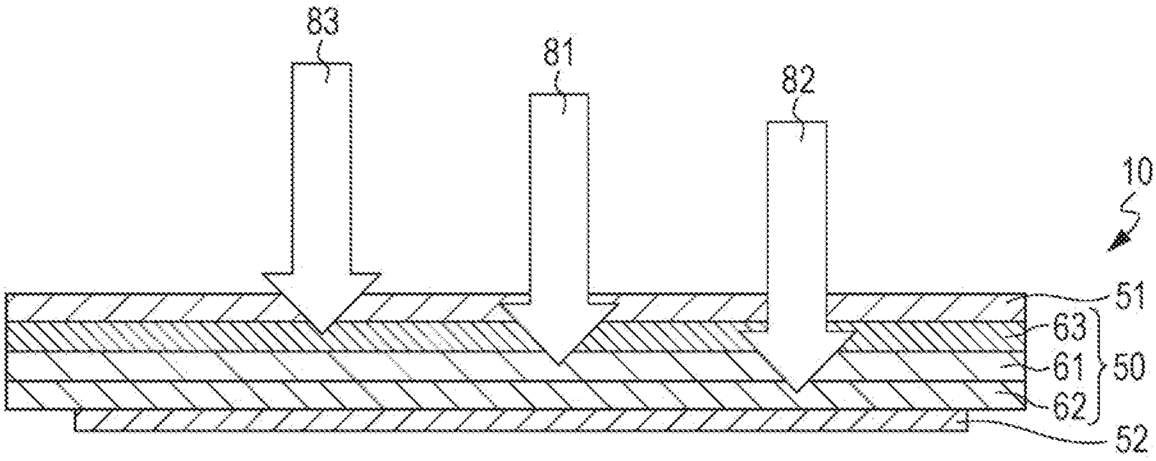
FIG. 5 is an explanatory schematic view illustrating absorption of light in the photoelectric converter according to the other aspect of the present disclosure.

As illustrated in FIG. 5, therefore, when the third layer 63 has a high absorbance for the light 83 in the third wavelength band 73, a proportion of the light 83 in the third wavelength band 73 reaching the first layer 61 and the second layer 62 is low. Accordingly, even when the absorbances of the first layer 61 and the second layer 62 are high for the light 83 in the third wavelength band 73, the multilayer body 50 can be designed such that the third layer 63 mainly absorbs the light 83 in the third wavelength band 73.

For example, if the absorbance of the third layer 63 in the third wavelength band 73 is 50% or more, 50% or more of the light 83 in the third wavelength band 73, incident on the photoelectric converter 10, does not reach both of the first layer 61 and the second layer 62. Hence the third layer 63 mainly absorbs the light 83 in the third wavelength band 73 regardless of the absorbances of the first layer 61 and the second layer 62. In other words, the absorbances of the first layer 61 and the second layer 62 for the light 83 in the third wavelength band 73 may be equal to or higher than the absorbance of the third layer 63 for the light 83 in the third wavelength band 73.

The absorbance of the third layer 63 for the light 83 in the third wavelength band 73 may be 50% or less. In this case, the absorbance allowable for each of the first layer 61 and the second layer 62 may be a predetermined value or less. For example, when the absorbance of the third layer 63 is 30%, up to 70% of the incident light reaches the first layer 61. In this case, if the absorbance of the first layer 61 is 42% or less, the rate of light absorption by the first layer 61 is 30% or less. It is hence understood that, even when the absorbance of the first layer 61 is higher than that of the third layer 63, the rate of absorbing the light incident on the photoelectric converter 10 is higher in the third layer 63 than in the first layer 61. Also when the absorbances of the first layer 61 and the second layer 62 are smaller than the absorbance of the third layer 63, it is apparent that the third layer 63 mainly absorbs the light 83 in the third wavelength band 73.

The requirements for the first layer 61 to mainly absorb the light 81 in the first wavelength band 71 are B1>B3 and B1>B2.

Here, as seen from the equation (6), focusing attention again to that the term (1−A3) is included in B1, the absorbance of the third layer 63 for the light 81 in the first wavelength band 71 has to be 50% or less. Furthermore, it is seen that B1 increases as the absorbance of the third layer 63 for the light 81 in the first wavelength band 71 decreases, and that B1 increases as the absorbance of the first layer 61 for the light 81 in the first wavelength band 71 increases.

Because the second layer 62 is positioned on the rear side of the first layer 61, only light having not been absorbed by the first layer 61 reaches the second layer 62. Accordingly, for the same reason as described above, when the absorbance of the first layer 61 is high, the above-mentioned requirements hold regardless of the absorbance of the second layer 62.

The requirements for the second layer 62 to mainly absorb the light 82 in the second wavelength band 72 are B2>B3 and B2>B1. As in the cases of the requirements for the third layer 63 and the first layer 61, B2 increases as the absorbance of the first layer 61 for the light 82 in the second wavelength band 72 decreases. The absorbance of the first layer 61 for the light 82 in the second wavelength band 72 may be, for example, 50% or less. Moreover, B2 increases as the absorbance of the second layer 62 for the light 82 in the second wavelength band 72 increases.

As understood from the above discussion, it is desirable that the third layer 63 exhibits a high absorbance in the third wavelength band 73 while it exhibits low absorbances in the first wavelength band 71 and the second wavelength band 72, that the first layer 61 exhibits a high absorbance in the first wavelength band 71 while it exhibits a low absorbance in the second wavelength band 72, and that the second layer 62 exhibits a high absorbance in the second wavelength band 72.

(2) Absorption Characteristics of Individual Layers

A method for realizing the absorption characteristics of the individual layers will be described below. As generally known, each of organic semiconductor materials and inorganic semiconductor materials has a wavelength called an absorption end, and exhibits a high absorbance for light of wavelengths shorter than the wavelength at the absorption end and a low absorbance for light of wavelengths longer than the wavelength at the absorption end. Therefore, the multilayer body 50 can exhibit the above-described spectral photoelectric conversion characteristic when the third layer 63 contains a semiconductor material having the absorption end near the lower end 71*d* of the first wavelength band 71, the first layer 61 contains a semiconductor material having the absorption end near the upper end 71*u* of the first wavelength band 71, and the second layer 62 contains a semiconductor material having the absorption end near the upper end 72*u* of the second wavelength band 72.

For example, the absorption end of P3HT (poly(3-hexylthiophene) polymer) is about 650 nm. The absorption end of copper phthalocyanine is about 800 nm, the absorption end of PCPDTBT (poly[2,6-(4,4-bis-(2-ethylhexyl)-4H-cyclopenta[2,1-b;3,4-b']dithiophene)-alt-4,7(2,1,3-benzothiadiazole)]) is about 900 nm, and the absorption end of tin phthalocyanine is about 1000 nm. The absorption end of $C_{60}$ is about 550 nm, the absorption end of PCBM is about 500 nm, and the absorption end of TCNQ is about 400 nm.

Figure 6:
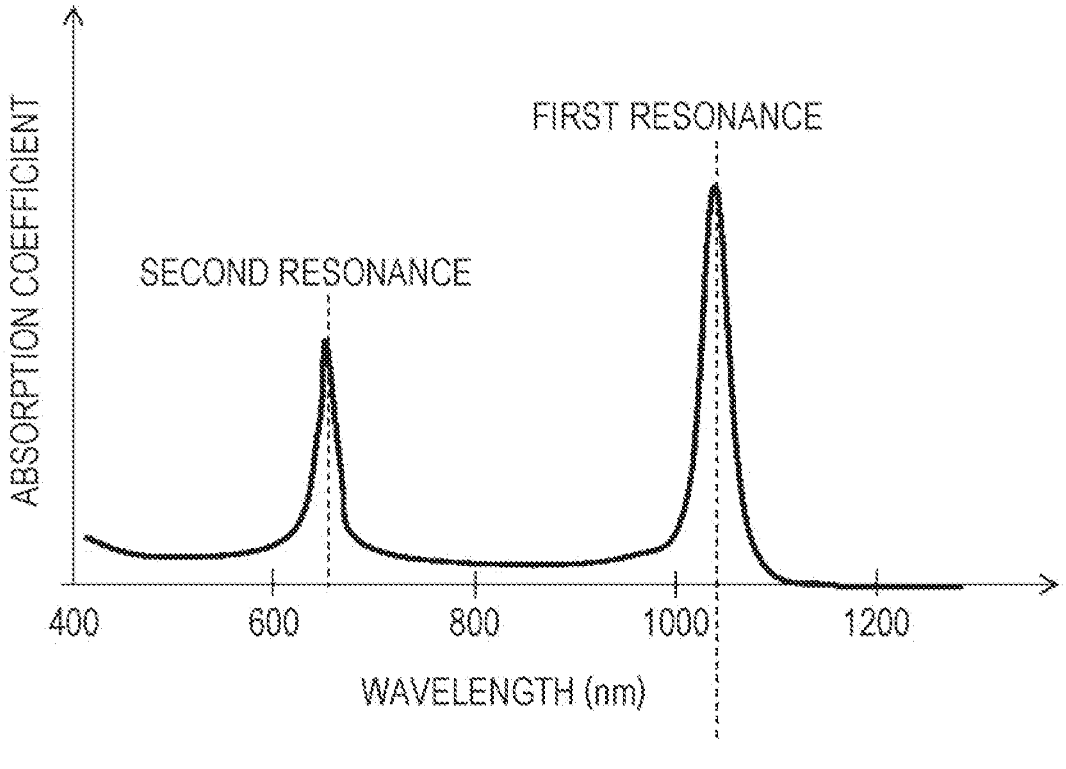
FIG. 6 is a graph depicting an example of an absorption spectrum of a semiconductor carbon nanotube.

Among the above-mentioned materials, a semiconductor carbon nanotube has a unique characteristic. As illustrated in FIG. 6, an absorption spectrum of the semiconductor carbon nanotube exhibits a high absorption coefficient in a half-width of several ten nanometers on both longer and shorter sides of a specific resonance wavelength, and a low absorption coefficient at other wavelengths. Furthermore, the absorption coefficient is substantially 0 at wavelengths longer than in the hem of a first resonance wavelength peak. In other words, the hem of the first resonance wavelength peak on the longer wavelength side provides the absorption end.

The above-mentioned resonance wavelengths are different depending on values of the so-called chirality of each semiconductor carbon nanotube. For example, in the case of (6,5) chirality, the first resonance wavelength is about 990 nm, and the second resonance wavelength is about 550 nm. In the case of (7,5) chirality, the first resonance wavelength is about 1050 nm, and the second resonance wavelength is about 650 nm. In the case of (9,8) chirality, the first resonance wavelength is about 1450 nm, and the second resonance wavelength is about 810 nm. There are ten or more types of semiconductor carbon nanotubes with values of the chirality which are generally easy to obtain.

For example, a width of the first wavelength band 71 can easily be set to several ten nanometers when the first layer 61 is formed by using a semiconductor carbon nanotube with single chirality.

The first layer 61, the second layer 62, and the third layer 63 are each not always required to be made of a single absorbent molecular material. By using multiple absorbent molecular materials with different absorption spectra, each layer can absorb light in a wider wavelength band than in the case of using the single absorbent molecular material.

The absorption end of each material changes about several ten nanometers to 100 nm depending on whether the material is in a crystal state or an amorphous state, in what kind of associated state the material is, and how the material is mixed with another material. Thus, the crystal state or the associated state of each layer and/or the mixed state with another material may be set different optionally in order to obtain the desired absorption characteristic of each layer.

Moreover, it is known that the absorption end of a nano structure, such as a quantum dot, changes depending on its size. Generally, a quantum dot with a larger core has the absorption end at a longer wavelength. In the case of a quantum dot containing lead sulfide (PbS) as a core, for example, the quantum dot with a core diameter of 2.2 nm has the absorption end at about 900 nm, and the quantum dot with a core diameter of 3.2 nm has the absorption end at about 1300 nm. The size of the nano structure contained in each layer may be changed in order to obtain the desired absorption characteristic of each layer. As other materials of the semiconductor core, there are known lead selenide, cadmium telluride, cadmium selenide, indium phosphide, and so on. Any of those materials also has similar properties that the wavelength at the absorption end depends on the core diameter.

(3) Quantum Efficiency

As seen from the formula (4), the external quantum efficiency of each layer in the multilayer body 50 is expressed by the product of the rate at which the relevant layer absorbs photons and the internal quantum efficiency of the relevant layer. In visible, near ultraviolet, and near infrared wavelength regions where the photoelectric converter 10 performs detection, the internal quantum efficiency usually has almost no wavelength dependency. Therefore, in order to obtain the significantly high external quantum efficiency of some layer in some wavelength band, it is just required to increase the rate at which the relevant layer absorbs photons in the relevant wavelength band, and to increase the internal quantum efficiency of the relevant layer. In order to reduce the external quantum efficiency of some layer in some wavelength band, it is just required to reduce the internal quantum efficiency of the relevant layer. In the photoelectric converter 10 according to the present disclosure, it is just required to increase the internal quantum efficiency of each of the third layer 63 and the second layer 62, and to reduce the internal quantum efficiency of the first layer 61. For example, the internal quantum efficiency of each of the third layer 63 and the second layer 62 may be 30% or more or 50% or more. The internal quantum efficiency of the first layer 61 may be 1% or less or 0.1% or less.

Photoelectric conversion in each layer of the multilayer body 50 occurs through the following steps.

STEP 1: Generation of Exciton

An absorbent molecule or an absorbent crystal absorbs one photon, whereupon an exciton generates in the molecule or the crystal.

STEP 2: Charge Separation

The exciton separates into an electron as a negative charge and a hole as a positive charge.

STEP 3: Charge Transport

The electron and the hole move separately and are collected by different electrodes.

In STEP 2 and STEP 3, there are competing processes. For example, there are a process in which the exciton does not separate into a hole and an electron and disappears with recombination, and a process in which a hole and an electron in movement collide with each other and disappear. The internal quantum efficiency increases as the number of occurrences of the competing processes decreases. Conversely, the internal quantum efficiency decreases as the number of occurrences of the competing processes increases.

For example, when the absorbent molecule is an organic molecule or a semiconductor carbon nanotube, the probability of absorption of a photon and generation of an exciton is high. However, the charge separation hardly occurs with the absorbent molecule alone, and the generated exciton disappears with recombination. In such a case, the absorbance is high, but the internal quantum efficiency is substantially 0.

On the other hand, it is known that the separation probability of hole-electron pairs can be increased by, instead of using the absorbent molecule alone, arranging a charge-acceptance molecule, which accepts a hole or an electron, near some absorbent molecule. Thus the internal quantum efficiency can be increased with such a technique.

The absorbent molecule and the charge-acceptance molecule in a set providing high internal quantum efficiency are called a donor molecule and an acceptor molecule, respectively. The absorbent molecule functioning as the donor molecule or tending to provide high internal quantum efficiency generally has such a feature that many electrons are present in an outer peripheral region of the molecule in the excited state, or that the lifetime of the excited state is long. For example, a semiconductor polymer such as P3HT (poly (3-hexylthiophene) polymer), PCPDTBT (poly[2,6-(4,4-bis-(2-ethylhexyl)-4H-cyclopenta[2,1-b;3,4-b']dithiophene)-alt-4,7(2,1,3-benzothiadiazole)]), an organic semiconductor such as copper phthalocyanine or tin phthalocyanine, and a semiconductor carbon nanotube are known as functioning as the donor molecules. Fullerenes such as $C_{60}$, PCBM, and KLOC-6 (made by Solenne BV), and tetracyanoquinodimethane (TCNQ) are known as functioning as the acceptor molecules for the above-mentioned donor molecules. It is generally known that a molecule having a deeper LUMO level than the absorbent molecule or a molecule having a shallower HOMO level than the absorbent molecule is more likely to function as the acceptor molecule for the relevant absorbent molecule.

The third layer 63 and the second layer 62 may be each made of a material functioning as the donor molecule, namely the absorbent molecule tending to provide high internal quantum efficiency, and a material functioning as the acceptor molecule.

On the other hand, some of the absorbent molecules tend to provide low internal quantum efficiency if they have such a feature that many electrons are present in a central region of the molecule in the excited state, or that the lifetime of the excited state is short. For example, the internal quantum efficiency of a molecule having the same basic skeleton as the donor molecule, but containing a long alkyl group or the like at a molecular end tends to be low. Accordingly, the molecules having the same basic skeletons as the donor molecules in the third layer 63 and the second layer 62, but containing long alkyl groups or the likes at the molecular ends may be included in the first layer 61.

A mixing ratio of the donor molecule to the acceptor molecule also affects the internal quantum efficiency. Generally, the internal quantum efficiency tends to increase when the mixing ratio of the donor molecule to the acceptor molecule is in the range of 1:10 to 10:1. Accordingly, the mixing ratio of the donor molecule to the acceptor molecule may be set to fall in the range of 1:10 to 10:1 for the third layer 63 and the second layer 62 in which the internal quantum efficiency is to be increased, and the mixing ratio may be set to a value outside the above-mentioned range for the first layer 61 in which the internal quantum efficiency is to be decreased. Alternatively, the mixing ratio of the donor molecule to the acceptor molecule may be set to fall in the range of 1:10 to 10:1 for all of the third layer 63, the second layer 62, and the first layer 61 while the mixing ratio may be changed for each of the layers or only for the first layer 61.

When the absorbent material is the quantum dot made of an inorganic material, the acceptor molecule is not always required to cause the charge separation. In other words, the quantum dot can exhibit high internal quantum efficiency by itself alone. Accordingly, the third layer 63 and the second layer 62 may be constituted only by the quantum dots. Each of the third layer 63 and the second layer 62 may further contain one or more other molecules in order to improve charge transport or physical characteristics.

Even for the quantum dot exhibiting a high absorbance, when the quantum dot is covered with an insulating material or a functional group, it is possible to inhibit movement of a hole and an electron generated inside the quantum dot to the outside, and to make the generated hole and electron disappear inside the quantum dot. In other words, by covering the quantum dot contained in a particular layer with the insulating material or the functional group, the internal quantum efficiency of the relevant layer can be reduced. Accordingly, the quantum dot covered with the insulating material or the functional group may be included in the first layer 61.

The internal quantum efficiency of the first layer 61 may be reduced by increasing the recombination probability of holes and electrons in the first layer 61. For example, when the first layer 61 contains a metal or a metallic carbon nanotube, the recombination probability of holes and electrons increases and the internal quantum efficiency decreases. Even in the case of a semiconductor material, the recombination probability of positive charges and negative charges can be increased, for example, in a material in which a band gap is narrow and the charge separation is difficult to function with the acceptor molecule. The recombination probability of positive charges and negative charges can also be increased by mixing a semiconductor carbon nanotube that has many crystal defects.

(4) Transport Characteristic

In order to increase the internal quantum efficiency in each of the third layer 63 and the second layer 62, the charge transport in STEP 3 is designed to be performed with high efficiency. For increasing the internal quantum efficiency, the holes and the electrons generated in the third layer 63 and the second layer 62 are collected in such a manner that one of the holes and the electrons is collected by the first electrode 51 and the other is collected by the second electrode 52. Thus the first layer 61, the second layer 62, and the third layer 63 have charge transport ability.

For example, when the second electrode 52 collects the holes, the holes generated in the third layer 63 move through the first layer 61 and the second layer 62. Furthermore, in this case, because the first electrode 51 collects the electrons, the electrons generated in the second layer 62 move through the first layer 61 and the third layer 63. In other words, the holes and the electrons are made movable in the first layer 61. The above point is similarly applied to the case in which the polarities of the charges collected by the first electrode 51 and the second electrode are reversed to those described above.

Accordingly, the first layer 61 may have characteristics capable of transporting both the hole and the electron. The absorbent molecule in the first layer 61 may perform the charge transport. Alternatively, the first layer 61 may contain, in addition to the absorbent molecule, a molecule for moving a charge. The transports of the hole and the electron may be performed by the same molecule or different molecules.

The molecule for moving the charge is not always required to function as the donor molecule or the acceptor molecule in combination with the absorbent molecule. Accordingly, for example, a molecule having a shallower LUMO level than the absorbent molecule may be used to transport the negative charge. For example, although SIMEF (silylmethyl fullerene) has a negative-charge transport characteristic, it has a shallower LUMO level than $C_{60}$, which is the general acceptor molecule, by about 0.3 eV and hence has a difficulty in functioning as the acceptor molecule for the absorbent molecule.

(5) Design Example

Figure 7:
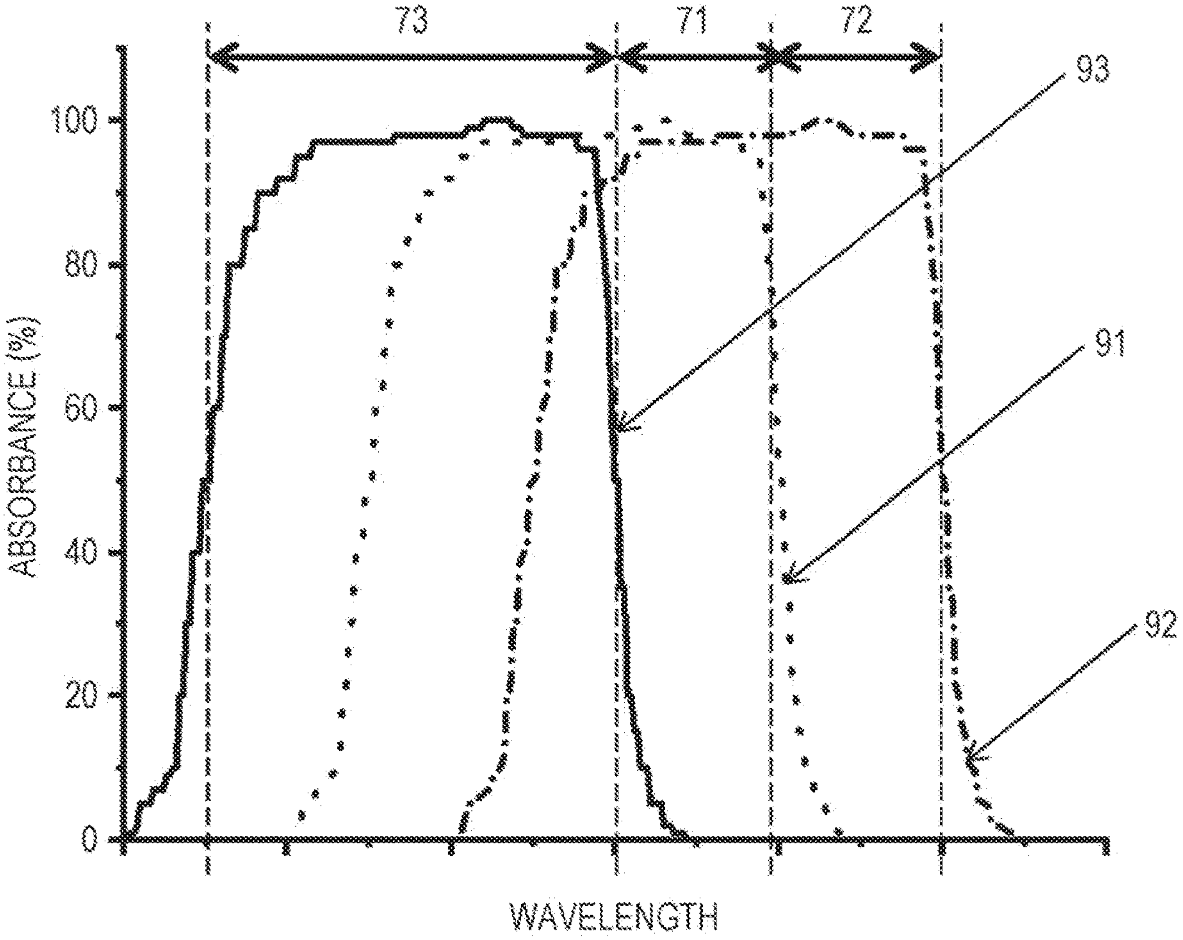
FIG. 7 is a graph depicting an absorption spectrum of each layer in the multilayer body of the photoelectric converter according to the one aspect of the present disclosure.

A design example of the multilayer body 50 satisfying the above-described requirements will be described below with reference to FIG. 7. FIG. 7 depicts an absorption spectrum of each of the layers in the multilayer body 50. An absorbance spectrum 93 of the third layer 63 has absorbances of 93%, 5% and 0% in the third wavelength band 73, the first wavelength band 71, and the second wavelength band 72, respectively. An absorbance spectrum 91 of the first layer 61 has absorbances of 58%, 95% and 5% in the third wavelength band 73, the first wavelength band 71, and the second wavelength band 72, respectively. An absorbance spectrum 92 of the second layer 62 has absorbances of 19%, 97% and 95% in the third wavelength band 73, the first wavelength band 71, and the second wavelength band 72, respectively.

The third layer 63 has the internal quantum efficiency of 60% in the third wavelength band 73, the first wavelength band 71, and the second wavelength band 72. The first layer 61 has the internal quantum efficiency of 0.1% in the third wavelength band 73, the first wavelength band 71, and the second wavelength band 72. The second layer 62 has the internal quantum efficiency of 60% in the third wavelength band 73, the first wavelength band 71, and the second wavelength band 72.

On those conditions, assuming that a proportion of light reaching the third layer 63 with respect to the incident light on the photoelectric converter 10 in some wavelength band is 100%, the rate of light absorption for each layer is as per listed in Table 2.

TABLE 2

| | Rate of Light Absorption | | |
|---|---|---|---|
| | Third Wavelength Band 73 | First Wavelength Band 71 | Second Wavelength Band 72 |
| Third Layer 63 | 93% | 6% | 0% |
| First Layer 61 | 2% | 90% | 6% |
| Second Layer 62 | 0% | 3.5% | 90% |

Thus, the third layer 63 mainly absorbs the light in the third wavelength band 73, the first layer 61 mainly absorbs the light in the first wavelength band 71, and the second layer 62 mainly absorbs the light in the second wavelength band 72. The external quantum efficiency for each layer is as per listed Table 3.

TABLE 3

| | External Quantum Efficiency for Each Layer | | |
|---|---|---|---|
| | Third Wavelength Band 73 | First Wavelength Band 71 | Second Wavelength Band 72 |
| Third Layer 63 | 55.8% | 3.6% | 0% |
| First Layer 61 | 0% | 0.1% | 0% |
| Second Layer 62 | 0% | 2.1% | 54% |

The external quantum efficiency of the photoelectric converter 10 is given as a value obtained by summing the external quantum efficiencies of the three layers. Table 4 indicates the summed value, and FIG. 8 depicts a spectral characteristic of the external quantum efficiency.

TABLE 4

| External Quantum Efficiency of Photoelectric Converter | | |
|---|---|---|
| Third Wavelength Band 73 | First Wavelength Band 71 | Second Wavelength Band 72 |
| 55.8% | 5.8% | 54% |

Figure 8:
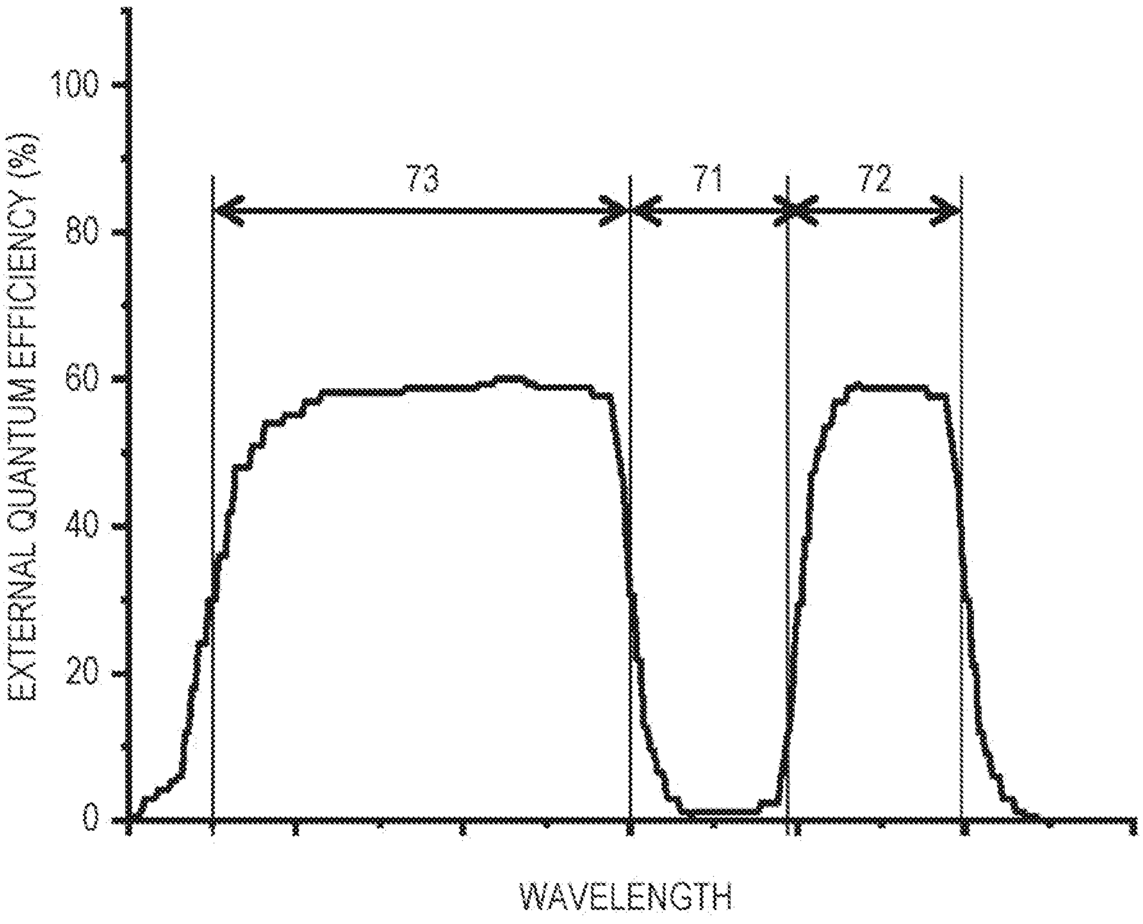
FIG. 8 is a graph depicting a wavelength characteristic of external quantum efficiency of the photoelectric converter according to the one aspect of the present disclosure.

As seen from FIG. 8, the photoelectric converter 10 including the multilayer body 50, designed as described above, has the significantly high external quantum efficiency in each of the third wavelength band 73 and the second wavelength band 72, and has the significantly low external quantum efficiency, namely ½ or less of the significantly high external quantum efficiency, in the first wavelength band 71.

The first wavelength band 71 is sandwiched between the third wavelength band 73 and the second wavelength band 72, and the photoelectric converter 10 has a similar characteristic to that obtained by using a stop filter (notch filter) in a photoelectric converter of the related art. However, since the spectral photoelectric conversion characteristic of the photoelectric converter 10 is obtained without using an interference filter, the characteristic does not depend on an incident angle to the photoelectric converter.

With the photoelectric converter 10 according to the present disclosure, as described above, since the first layer 61 with the high absorbance and the low internal quantum efficiency is arranged on the front side of the second layer 62, namely on the side closer to an incident surface than the second layer 62, part of a wavelength band in which the second layer 62 has sensitivity can be restricted and the photoelectric converter 10 can have sensitivity in the second wavelength band that is narrower than the wavelength band in which the second layer 62 has sensitivity. Furthermore, since the third layer 63 is arranged on the side closer to the incident surface than the first layer 61, the photoelectric converter 10 can have sensitivity in the third wavelength band. As a result, the photoelectric converter 10 can be given with such a spectral photoelectric conversion characteristic as exhibiting substantially no sensitivity in the first wavelength band 71 sandwiched between the third wavelength band 73 and the second wavelength band 72. For the reason described above, the first wavelength band 71 can be narrowed in comparison with the wavelength band in which the second layer 62 has sensitivity and exhibits the large absorbance.

4. Examples

Figure 9:
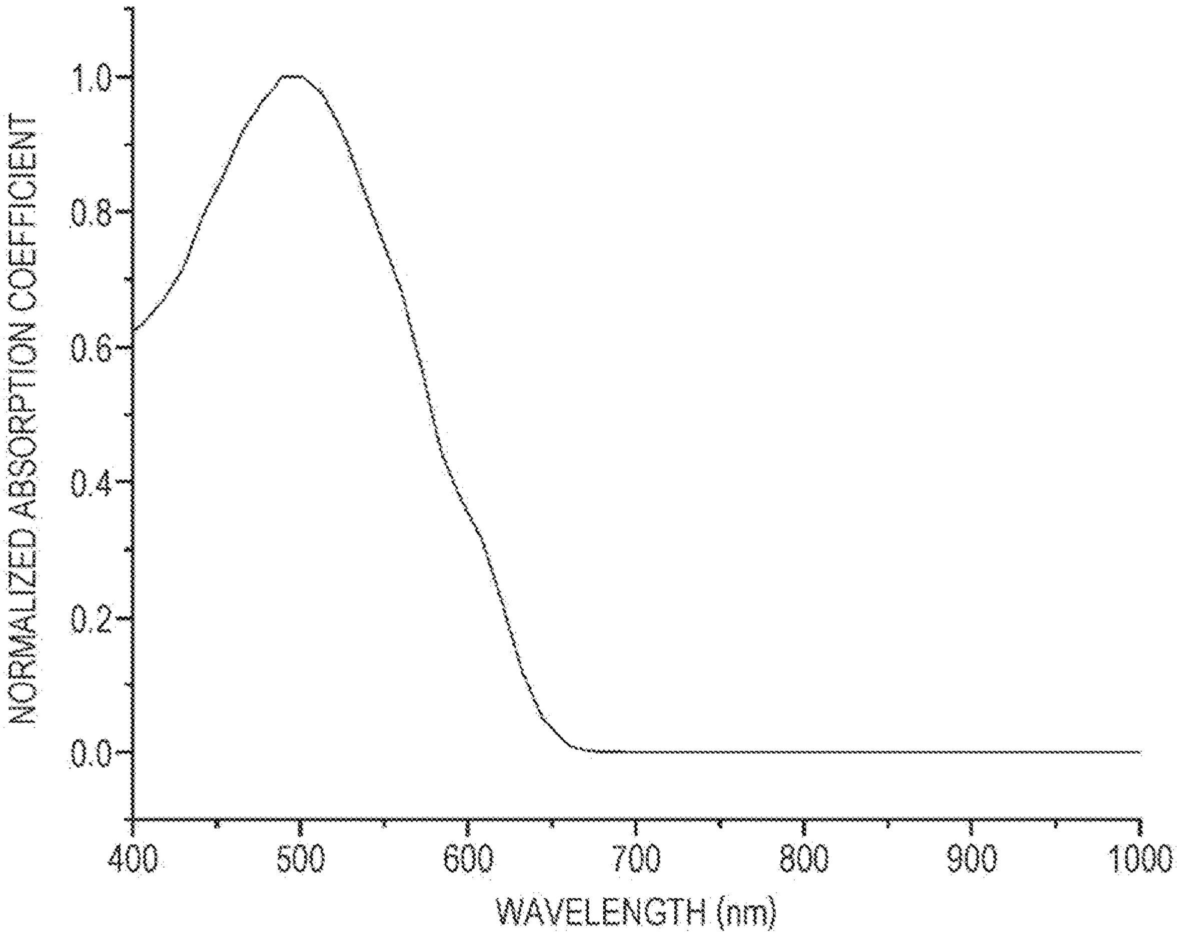
FIG. 9 is a graph depicting a wavelength characteristic of an absorption coefficient of a material that can be used as a third layer.
Figure 10:
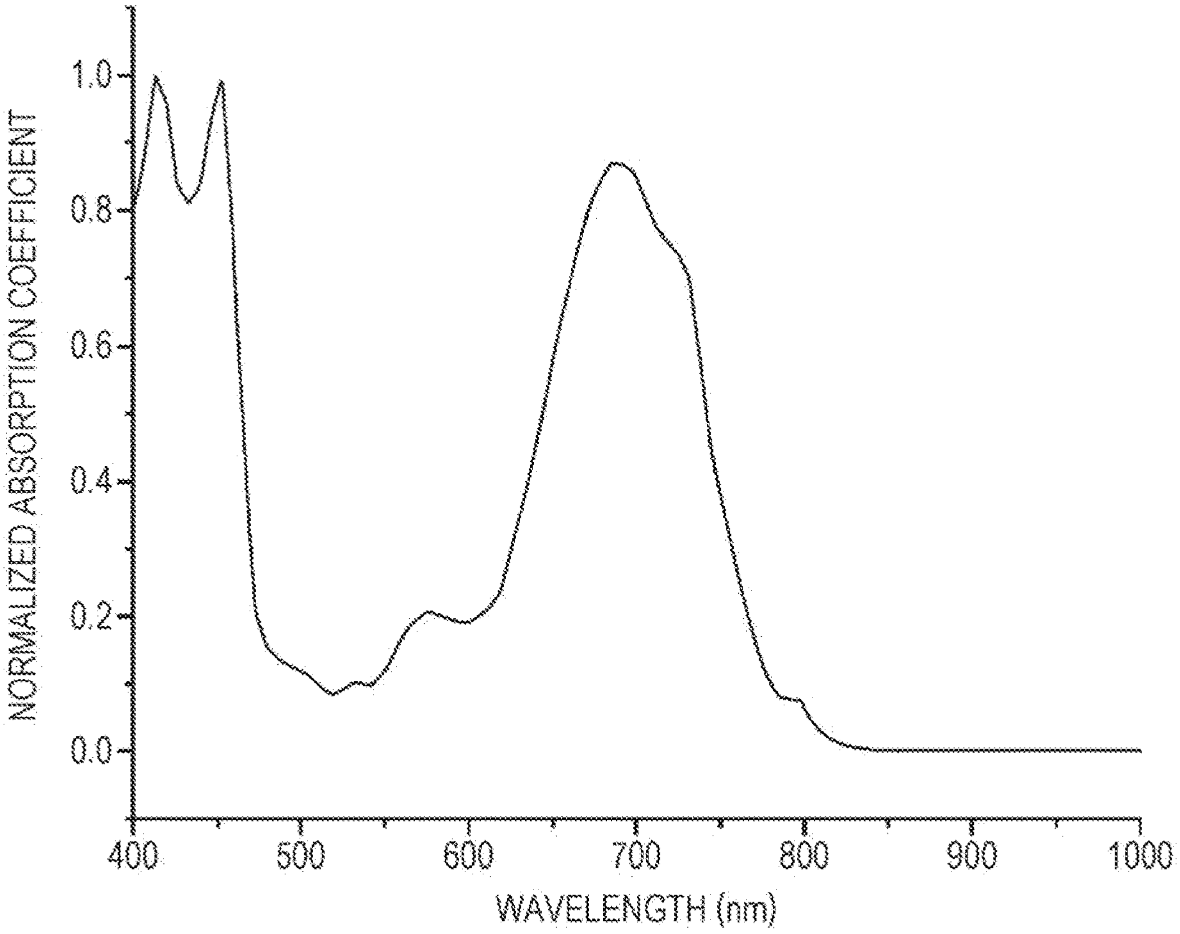
FIG. 10 is a graph depicting a wavelength characteristic of an absorption coefficient of a material that can be used as a first layer.
Figure 11:
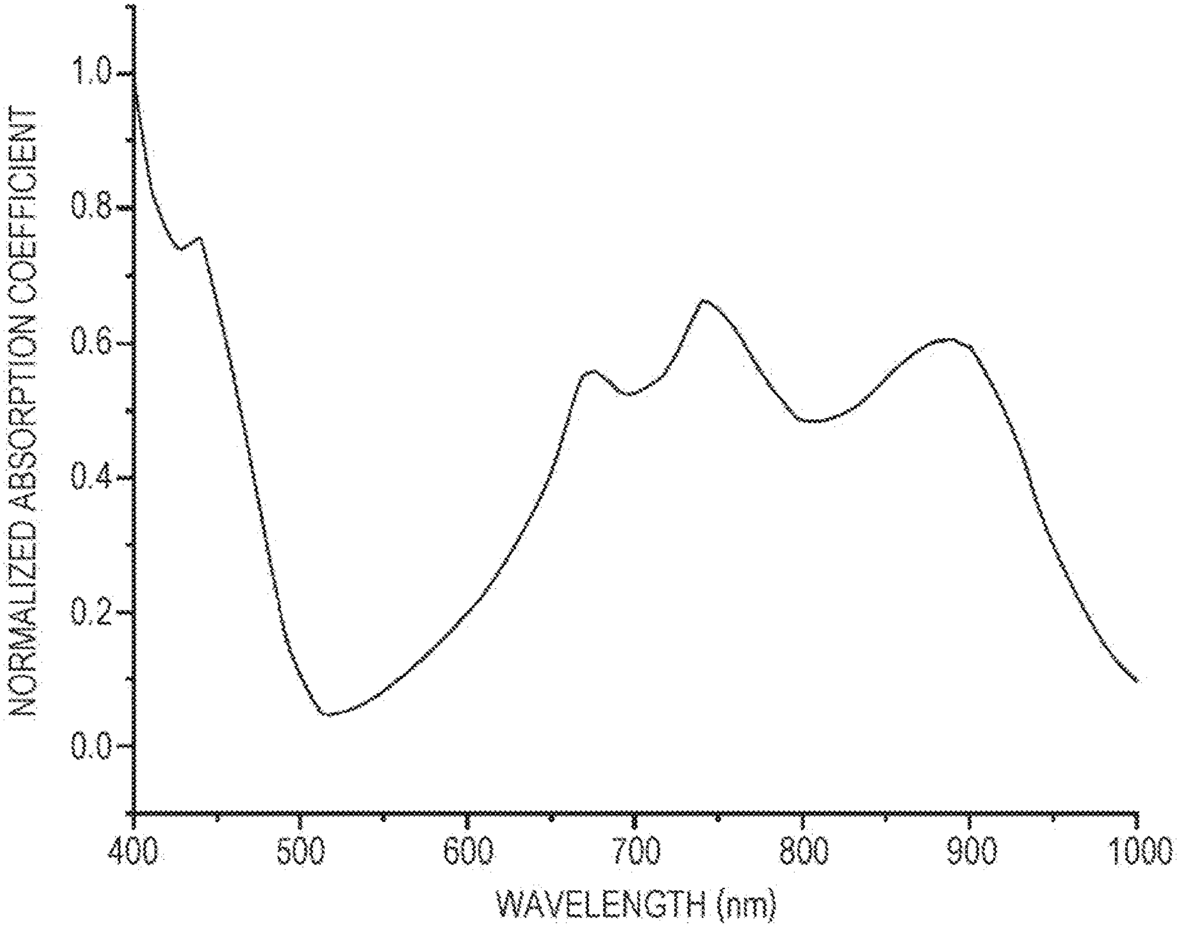
FIG. 11 is a graph depicting a wavelength characteristic of an absorption coefficient of a material that can be used as a second layer.

More specific examples of the structure of the multilayer body 50 will be described below. FIGS. 9 to 11 depict wavelength characteristics of the absorption coefficients of materials that can be used in the third layer 63, the first layer 61, and the second layer 62. The absorption coefficient is normalized with respect to thickness. FIG. 9 depicts the normalized absorption coefficient of a film made of a mixed material (hereinafter called a "material system A") of P3HT (poly(3-hexylthiophene) and PCBM (phenyl-$C_{61}$ butyric acid methyl ester). P3HT is a light absorption material having the absorption end at about 650 nm, and PCBM has the absorption end at a shorter wavelength than 650 nm. Therefore, the absorption end of the mixed film of P3HT and PCBM is given by the absorption end of P3HT. PCBM has a function of receiving an electron from an exciton in P3HT. The mixing ratio of the mixed film described here, by way of example, falls in the range of 1:10 to 10:1. Accordingly, this mixed film has high internal quantum efficiency. P3Ht can transport the hole, and PCBM can transport the electron.

FIG. 10 depicts the normalized absorption coefficient of a film made of a mixed material (hereinafter called a "material system B") of tin phthalocyanine and $C_{60}$. Tin phthalocyanine is a light absorption material having the absorption end at about 800 nm, and $C_{60}$ has the absorption end at about 500 nm shorter than 800 nm. Therefore, the absorption end of this mixed film is about 800 nm. $C_{60}$ has a function of receiving a negative charge from an exciton in tin phthalocyanine. However, the mixing ratio of the mixed film described here, by way of example, is set such that the ratio of $C_{60}$ to tin phthalocyanine is 1 or less to 10. Accordingly, this mixed film described here, by way of example, does not exhibit so high internal quantum efficiency. Tin phthalocyanine can transport the hole, and $C_{60}$ can transport the electron.

FIG. 11 depicts the normalized absorption coefficient of a film made of a mixed material (hereinafter called a "material system C") of lead phthalocyanine and $C_{60}$. Lead phthalocyanine is a light absorption material having the absorption end at about 1100 nm. Therefore, the absorption end of this mixed film is also about 1100 nm. $C_{60}$ has a function of receiving an electron from an exciton in lead phthalocyanine. The mixing ratio of the mixed film described here, by way of example, falls in the range of 1:10 to 10:1. Accordingly, this mixed film has high internal quantum efficiency. Lead phthalocyanine can transport the hole, and $C_{60}$ can transport the electron.

Figure 12:
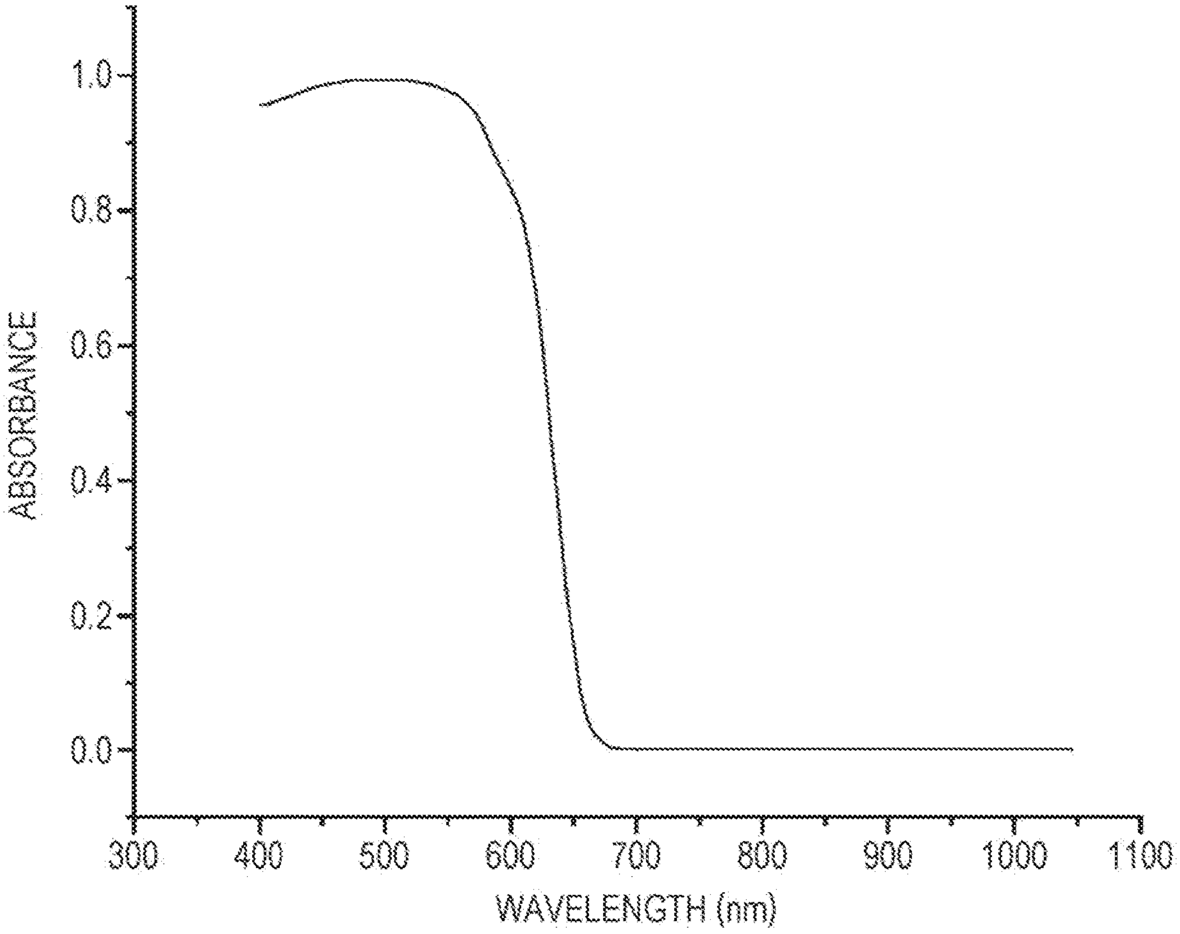
FIG. 12 is a graph depicting a wavelength characteristic of an absorbance of the third layer.
Figure 13:
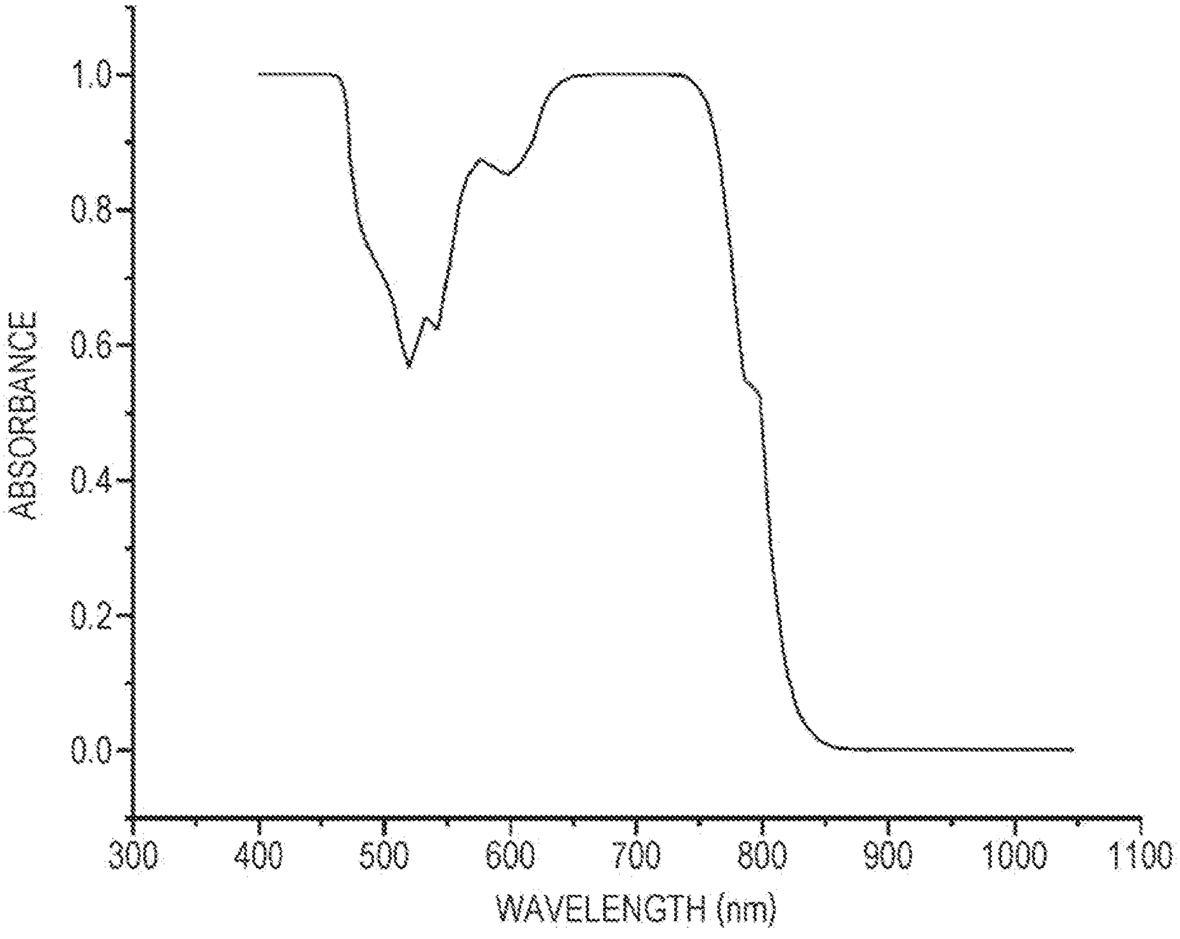
FIG. 13 is a graph depicting a wavelength characteristic of an absorbance of the first layer.
Figure 14:
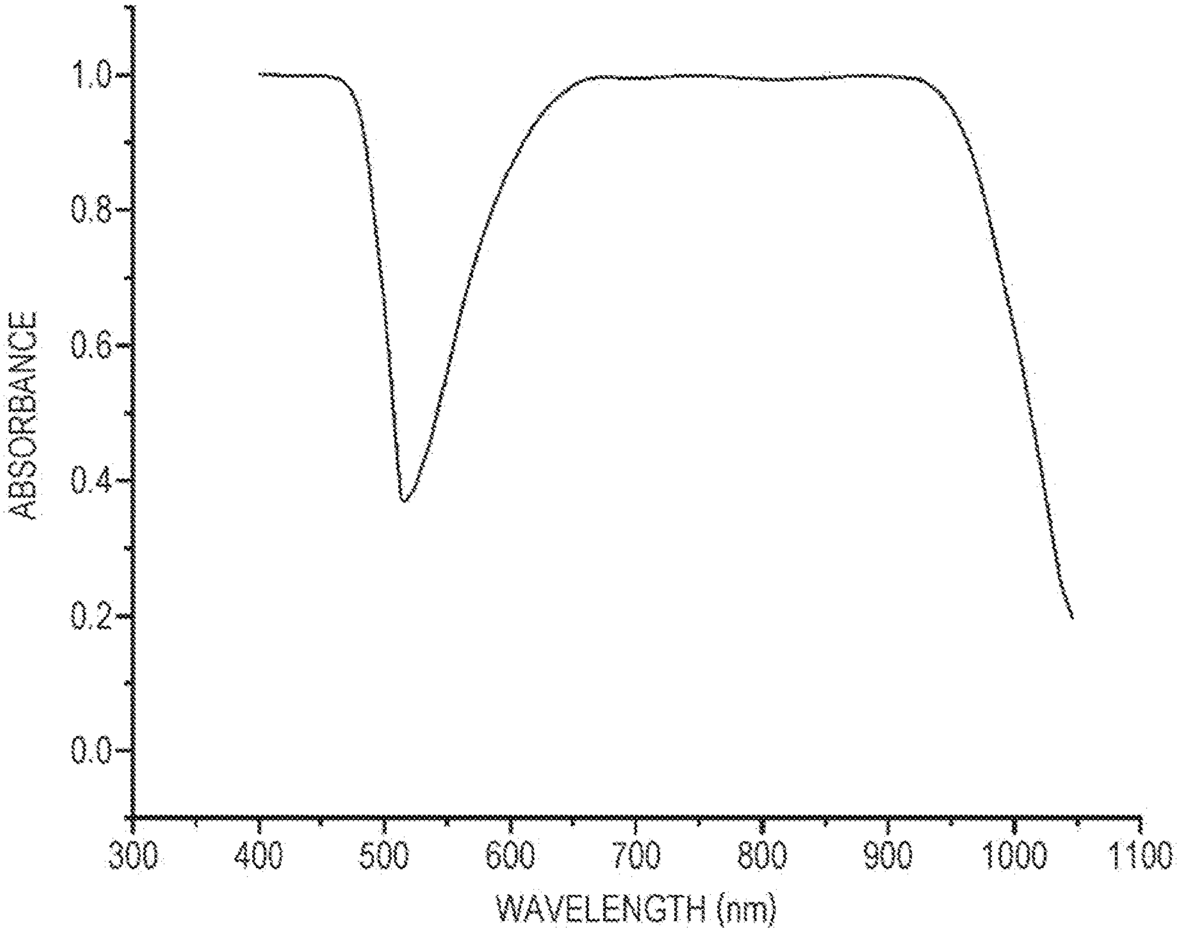
FIG. 14 is a graph depicting a wavelength characteristic of an absorbance of the second layer.

FIGS. 12 to 14 depict wavelength characteristics of the absorbances of the third layer 63, the first layer 61, and the second layer 62 that are prepared using the material systems A, B and C, respectively. Each of those layers has a thickness of several ten to several hundred nanometers. In the third layer 63, the mixing ratio of the two materials in the material system A is about 1:1. In the first layer 61, the content of $C_{60}$ of the two materials in the material system B is 1% or less. In the second layer 62, the mixing ratio of the two materials in the material system C is about 1:1.

Figure 15:
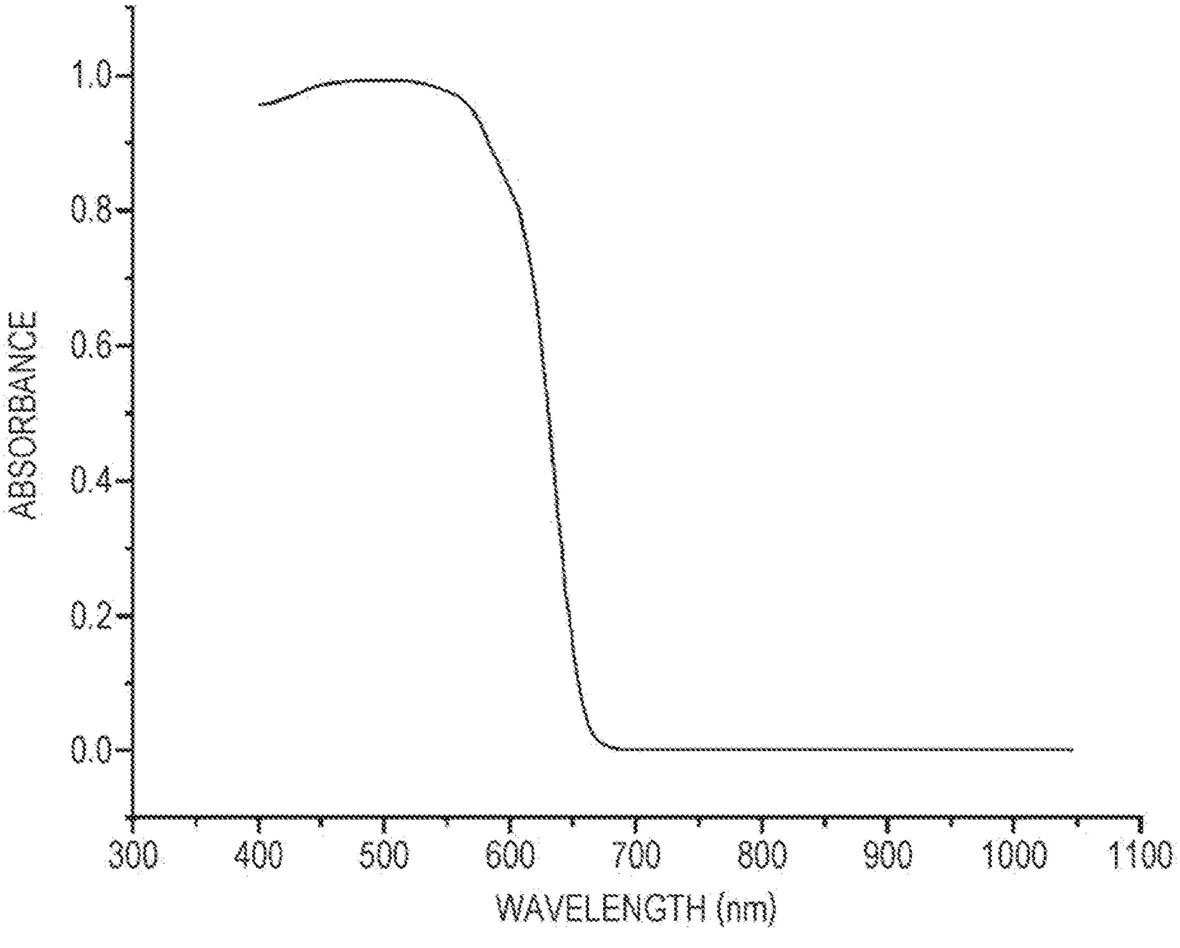
FIG. 15 is a graph depicting a wavelength characteristic of the absorbance of the third layer when light is incident on the multilayer body from a first electrode side.
Figure 16:
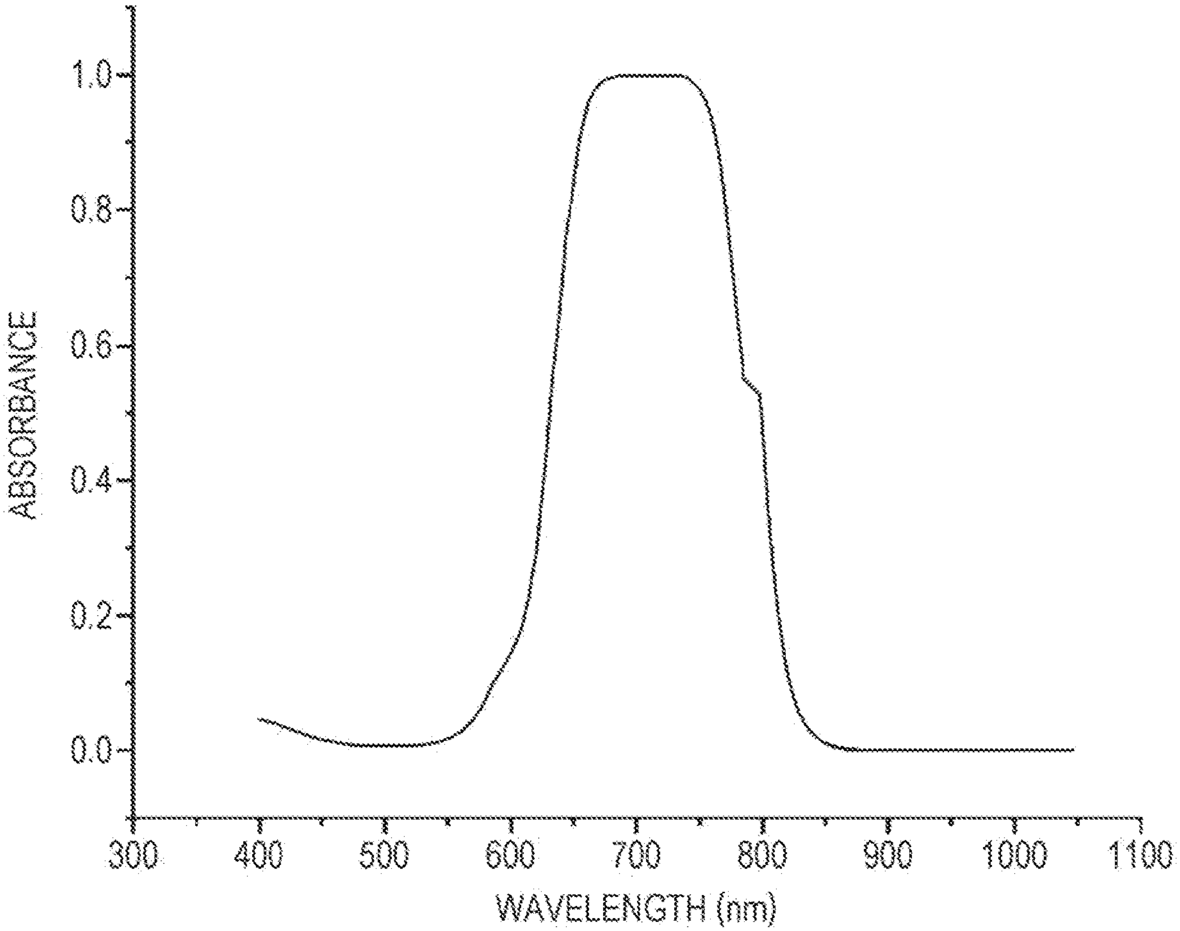
FIG. 16 is a graph depicting a wavelength characteristic of the absorbance of the first layer when light is incident on the multilayer body from the first electrode side.
Figure 17:
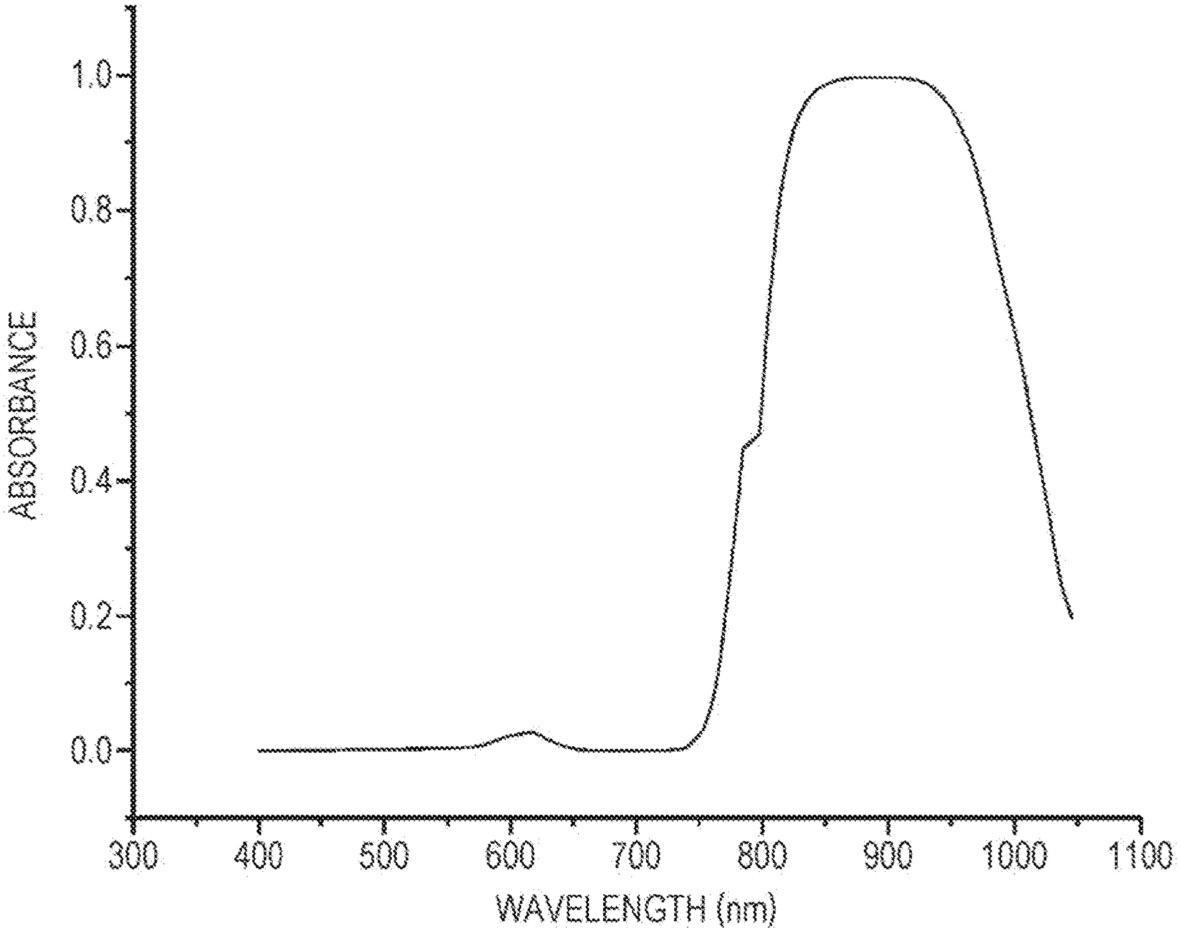
FIG. 17 is a graph depicting a wavelength characteristic of the absorbance of the second layer when light is incident on the multilayer body from the first electrode side.

FIGS. 15 to 17 depict the absorbances of the third layer 63, the first layer 61, and the second layer 62 when light is applied to the multilayer body 50 that is constituted by laminating the above-described third layer 63, first layer 61, and second layer 62. It is assumed that there is no reflection at the surface of each layer.

Figure 18:
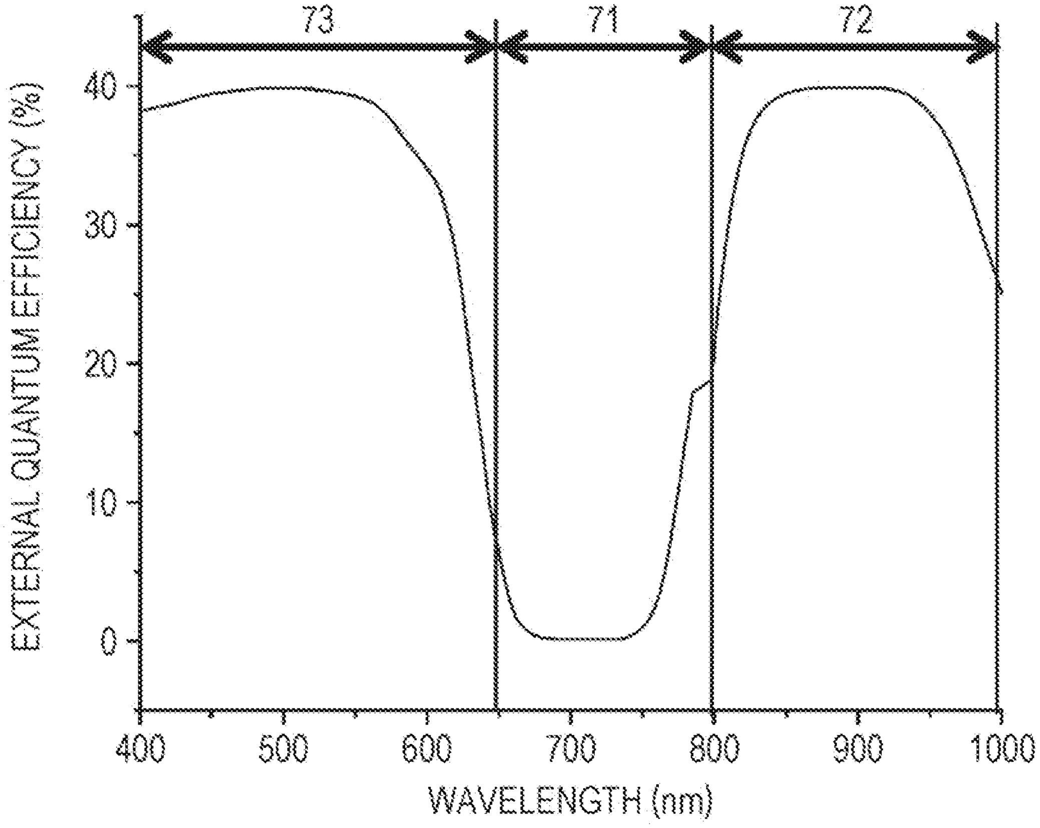
FIG. 18 is a graph depicting a wavelength characteristic of the external quantum efficiency of the photoelectric converter.

FIG. 18 depicts a wavelength characteristic of the external quantum efficiency of the photoelectric converter 10 on an assumption that the internal quantum efficiency of each of the third layer 63 and the second layer 62 is 40% and the internal quantum efficiency of the first layer 61 is 0.1%. Assuming now that the third wavelength band 73 is from 400 nm to 650 nm, the first wavelength band 71 is from 650 nm to 800 nm, and the second wavelength band 72 is from 800 nm to 1000 nm, average values of the external quantum efficiency of those three wavelength bands are 36%, 4%, and 33%, respectively. Here, 650 nm and 800 nm are the upper end of the third wavelength band 73 and the upper end of the first wavelength band 71, respectively. Accordingly, the external quantum efficiency of the first wavelength band 71 is ⅛ or less of the external quantum efficiency of each of the third wavelength band 73 and the second wavelength band 72.

In the first wavelength band 71 defined as described above, an average value of the external quantum efficiency in a wavelength band from 690 nm to 730 nm is 0.1%. Thus, according to the wavelength characteristic, depicted in FIG. 18, of the external quantum efficiency of the photoelectric converter 10, it is possible, for example, to set, as the stop band, a band that is narrower than the first wavelength band 71 and that has lower external quantum efficiency than in the first wavelength band 71. Unwanted sensitivity can be further reduced by applying the above-mentioned band to, for example, wavelengths of illumination where image pickup is not to be performed.

5. Modifications

Figure 19:
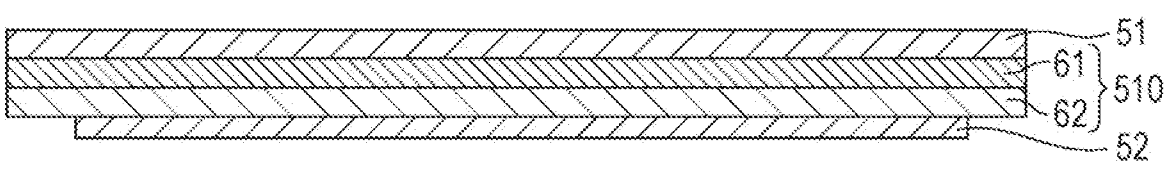
FIG. 19 is a schematic view illustrating a section of another example of the photoelectric converter according to the one aspect of the present disclosure.
Figure 20:
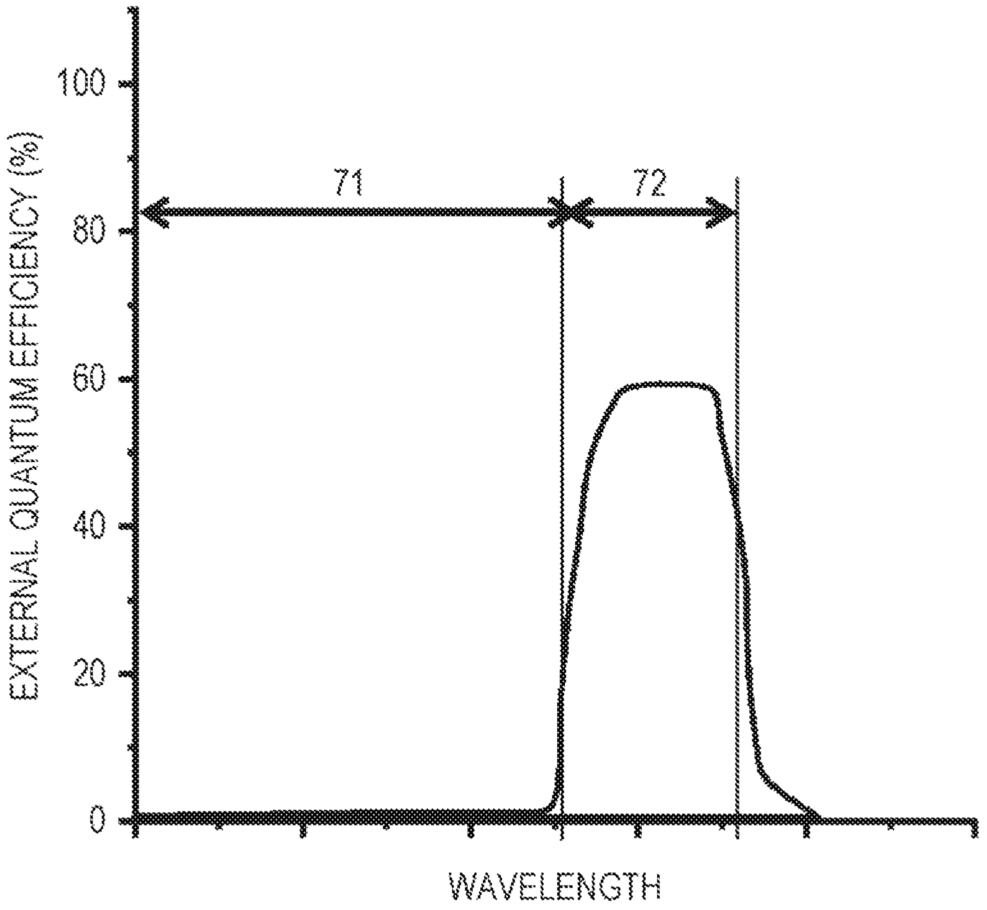
FIG. 20 is a graph depicting a wavelength characteristic of the external quantum efficiency of the photoelectric converter illustrated in FIG. 19.

The photoelectric converter, the image sensor, and the image pickup device according to the present disclosure can be variously modified. For example, while the photoelectric converter 10 includes the third layer 63 in the above-described embodiment, the photoelectric converter is not always required to include the third layer 63. A photoelectric converter 100 illustrated in FIG. 19 includes the first electrode 51, the second electrode 52, and a multilayer body 510 positioned between the first electrode 51 and the second electrode 52. The multilayer body 510 includes the first layer 61 and the second layer 62, but it does not include the third layer 63. In other words, the photoelectric converter 100 has the same structure as the photoelectric converter 10 except for not including the third layer 63. FIG. 20 is a graph depicting a wavelength characteristic of the external quantum efficiency of the photoelectric converter 100.

According to the photoelectric converter 100, the first layer 61 is positioned on the side closer to the first electrode 51, and the second layer 62 is positioned on the side closer to the second electrode 52. Of the light incident on the photoelectric converter 100 from the first electrode 51, therefore, the light in the first wavelength band 71 is absorbed by the first layer 61, and a photoelectric conversion characteristic is realized in which the external quantum efficiency is low in the first wavelength band 71 and is high in the second wavelength band 72.

The image sensor according to the present disclosure may include the optical filter as described above with reference to FIG. 2. In the image sensor, for example, the two-dimensionally arranged multiple pixels 14 are grouped, for example, such that four pixels 14 form one color pixel group. The pixels 14 in each color pixel group are classified into first to fourth pixels. As the color filter 53, the first pixel includes an optical filter transmitting light in the range of 400 nm to 500 nm therethrough, the second pixel includes an optical filter transmitting light in the range of 500 nm to 600 nm therethrough, and the third pixel includes an optical filter transmitting light in the range of 600 nm to 700 nm therethrough. The fourth pixel does not include the color filter 53.

With the image sensor constituted as described above, the first pixel can pick up an image of a blue component, the second pixel can pick up an image of a green component, the third pixel can pick up an image of a red component, and the fourth pixel can pick up an image in each of a visible range and an infrared range. Even when an upper limit value of a transmission range of the filter on the third pixel is not 700 nm, but 750 nm that is inherently in an infrared range, a wavelength range of light actually detected by the third pixel is from 600 nm to 700 nm because the external quantum efficiency of the first wavelength band 71 of the photoelectric converter is low.

Thus a more complicated sensitivity characteristic can be realized by combining wavelength dependency control for the external quantum efficiency of the photoelectric converter according to the present disclosure with the optical filter. On the other hand, characteristics demanded for the optical filter can be mitigated.

Furthermore, the structure of the multilayer body in the photoelectric converter according to the present disclosure is not limited to the combinations described in the above embodiments, namely the combination of the first layer 61, the second layer 62, and the third layer 63, and the combination of the first layer 61 and the second layer 62. For example, each of the layers arranged on the sides closer to the first electrode 51 and the second electrode 52 than the first layer, namely the layer in which the internal quantum efficiency is low, is not limited to a single layer, and it may be constituted by two or more layers.

What is claimed is:

1. A photoelectric converter comprising:

a first electrode containing a transparent conductive material;

a second electrode; and a multilayer body that is positioned between the first electrode and the second electrode, and that has a photoelectric conversion function, wherein the multilayer body includes a first layer and a second layer positioned between the first layer and the second electrode, the first layer absorbs light in a first wavelength band of 360 nm or longer and transmits light in a second wavelength band, the second wavelength band including wavelengths longer than wavelengths included in the first wavelength band, the second layer absorbs the light in the second wavelength band, and the multilayer body substantially does not have sensitivity for photoelectric conversion in the first wavelength band and has sensitivity for photoelectric conversion in the second wavelength band.

2. The photoelectric converter according to claim 1, wherein the multilayer body further includes a third layer positioned between the first electrode and the first layer, the third layer absorbs light in a third wavelength band including wavelengths shorter than the wavelengths included in the first wavelength band, and transmits the light in the first wavelength band and the light in the second wavelength band, and the multilayer body has sensitivity for photoelectric conversion in the third wavelength band.

3. The photoelectric converter according to claim 1, wherein the first layer has charge transport ability.

4. The photoelectric converter according to claim 2, wherein the third layer has charge transport ability.

5. The photoelectric converter according to claim 1, wherein a total of external quantum efficiencies of all layers included in the multilayer body in the first wavelength band, the layers including the first layer and the second layer, is smaller than a total of external quantum efficiencies of all the layers in the second wavelength band.

6. The photoelectric converter according to claim 2, wherein a total of external quantum efficiencies of all layers included in the multilayer body in the first wavelength band, the layers including the first layer, the second layer, and the third layer, is smaller than a total of external quantum efficiencies of all the layers in the second wavelength band, and is smaller than a total of external quantum efficiencies of all the layers in the third wavelength band.

7. The photoelectric converter according to claim 1, wherein the first layer contains tin phthalocyanine and $C_{60}$, and the second layer contains lead phthalocyanine and $C_{60}$.

8. The photoelectric converter according to claim 2, wherein the first layer contains tin phthalocyanine and $C_{60}$, the second layer contains lead phthalocyanine and $C_{60}$, and the third layer contains poly(3-hexylthiophene) and phenyl-$C_{61}$ butyric acid methyl ester.

9. An image sensor comprising:

photoelectric converters including first electrodes, multilayer bodies and second electrodes, wherein each of the photoelectric converters is the photoelectric converter according to claim 1, each of the first electrodes is the first electrode of the photoelectric converter according to claim 1, each of the multilayer bodies is the multilayer body of the photoelectric converter according to claim 1, each of the second electrodes is the second electrode of the photoelectric converter according to claim 1, the first electrodes are connected to one another, the multilayer bodies are connected to one another, the second electrodes are separated from one another, and the photoelectric converters are arranged one-dimensionally or two-dimensionally.

* * * * *